(12) United States Patent
Nirengi et al.

(10) Patent No.: US 12,501,554 B2
(45) Date of Patent: Dec. 16, 2025

(54) WIRING TRANSFER PLATE, WIRING-EQUIPPED WIRING TRANSFER PLATE, WIRING BODY INTERMEDIATE MATERIAL, AND METHOD FOR MANUFACTURING WIRING BODY

(71) Applicant: Panasonic Intellectual Property Management Co., Ltd., Osaka (JP)

(72) Inventors: Takayoshi Nirengi, Osaka (JP); Akihiro Oishi, Osaka (JP); Tsutomu Aisaka, Osaka (JP); Daisuke Matsushita, Osaka (JP); Jumpei Iwanaga, Osaka (JP); Tadashi Tojo, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 278 days.

(21) Appl. No.: 18/549,826

(22) PCT Filed: Mar. 16, 2022

(86) PCT No.: PCT/JP2022/011951
§ 371 (c)(1),
(2) Date: Sep. 8, 2023

(87) PCT Pub. No.: WO2022/202552
PCT Pub. Date: Sep. 29, 2022

(65) Prior Publication Data
US 2024/0155774 A1    May 9, 2024

(30) Foreign Application Priority Data
Mar. 22, 2021   (JP) .................................. 2021-046748

(51) Int. Cl.
*H05K 3/20*    (2006.01)
*C23C 18/38*   (2006.01)
(Continued)

(52) U.S. Cl.
CPC ............... *H05K 3/20* (2013.01); *C23C 18/38* (2013.01); *H01L 21/4846* (2013.01);
(Continued)

(58) Field of Classification Search
CPC . C23C 18/38; H01L 21/4846; H01L 21/6835; H01L 2221/68318;
(Continued)

(56) References Cited

U.S. PATENT DOCUMENTS

| 5,916,735 A | 6/1999 | Nakashima et al. |
| 6,162,569 A | 12/2000 | Nakashima et al. |

(Continued)

FOREIGN PATENT DOCUMENTS

| JP | 09-139564 A | 5/1997 |
| JP | H11-112126 A | 4/1999 |

(Continued)

OTHER PUBLICATIONS

International Search Report issued on Jun. 14, 2022 in International Patent Application No. PCT/JP2022/011951, with English translation.

(Continued)

*Primary Examiner* — Sonya M Sengupta
(74) *Attorney, Agent, or Firm* — Rimon P.C.

(57) ABSTRACT

A wiring transfer plate for forming wiring to be transferred to another component includes: a base; a plating base material layer formed as a release layer on the base; an insulating layer covering the base with an opening above the plating base material layer; and a projecting structure formed on the insulating layer for forming, in an insulating layer of a component to which the wiring is to be transferred, a via hole for a via electrode.

4 Claims, 17 Drawing Sheets

(51) Int. Cl.
  *H01L 21/48* (2006.01)
  *H05K 3/10* (2006.01)
  *H05K 3/18* (2006.01)

(52) U.S. Cl.
  CPC ........... *H05K 3/108* (2013.01); *H05K 3/18* (2013.01); *H05K 2203/072* (2013.01); *H05K 2203/0723* (2013.01)

(58) Field of Classification Search
  CPC .......... H01L 2221/68359; H01L 2221/68381; H05K 2203/072; H05K 2203/0723; H05K 3/108; H05K 3/18; H05K 3/20; H05K 3/205; H05K 3/423; H05K 3/4658; H05K 3/4682
  See application file for complete search history.

(56) References Cited

U.S. PATENT DOCUMENTS

| | | | |
|---|---|---|---|
| 2008/0052905 | A1 | 3/2008 | Watanabe et al. |
| 2010/0051172 | A1 | 3/2010 | Kim et al. |
| 2012/0326334 | A1 | 12/2012 | Sakaguchi |
| 2014/0311771 | A1 | 10/2014 | Shimizu et al. |
| 2020/0211946 | A1 | 7/2020 | Miki et al. |
| 2022/0061164 | A1 | 2/2022 | Nirengi et al. |
| 2024/0155774 | A1* | 5/2024 | Nirengi .................. H05K 3/108 |

FOREIGN PATENT DOCUMENTS

| | | |
|---|---|---|
| JP | 4798439 B2 | 10/2011 |
| JP | 5558623 B1 | 7/2014 |
| JP | 5808586 B2 | 11/2015 |
| JP | 2020-088105 A | 6/2020 |
| JP | 2020-107681 A | 7/2020 |
| JP | 2020-129576 A | 8/2020 |
| JP | 2020-166033 A | 10/2020 |
| JP | 2020-182006 A | 11/2020 |
| WO | 2020/144959 A1 | 7/2020 |

OTHER PUBLICATIONS

Extended European Search Report dated Oct. 1, 2024 issued in the corresponding European Patent Application No. 22775340.7.

* cited by examiner

[Wiring transfer plate preparation]

(a)

⇩

[Electroless plating layer formation]

(b)

⇩

[Electroless plating layer formation]

(c)

⇩

[Adhesion treatment]

(d)

[Catalyst-base-material-equipped base reception]

(a)

[Insulating layer formation]

(b)

[Exposure]

(c)

[Development]

(d)

[Baking]

(e)

[Projecting structure formation]

(f)

WIRING TRANSFER PLATE, WIRING-EQUIPPED WIRING TRANSFER PLATE, WIRING BODY INTERMEDIATE MATERIAL, AND METHOD FOR MANUFACTURING WIRING BODY

CROSS-REFERENCE OF RELATED APPLICATIONS

This application is the U.S. National Phase under 35 U.S.C. § 371 of International Patent Application No. PCT/JP2022/011951, filed on Mar. 16, 2022, which in turn claims the benefit of Japanese Patent Application No. 2021-046748, filed on Mar. 22, 2021, the entire disclosures of which Applications are incorporated by reference herein.

TECHNICAL FIELD

The present disclosure relates to a wiring transfer plate, a wiring-equipped wiring transfer plate, a wiring body intermediate material, and a method for manufacturing a wiring body, and in particular, to a wiring transfer plate or the like for manufacturing a wiring body formed as a wiring layer or a redistribution layer (RDL) of a mounting substrate such as a semiconductor package substrate.

BACKGROUND ART

The demand for smaller, more highly integrated, and more sophisticated semiconductor devices has led to a variety of packaging techniques for semiconductor devices. In recent years, 2.5D semiconductor packages, in which a silicon interposer provided with a plurality of semiconductor devices of different types is mounted on a semiconductor package substrate, have become the mainstream packaging technique for semiconductor devices. In 2.5D semiconductor packages, signal connections between the plurality of semiconductor devices are connected by fine circuits on the silicon interposer, and the entire silicon interposer can be regarded as a single "system on chip" (SoC) with integrated functions.

The silicon interposer includes a silicon wafer. In a silicon interposer, a fine multilayer wiring layer is formed by a semiconductor process on the front of the silicon wafer where the semiconductor devices are mounted, and connection terminals and electrical circuits that are connected to the semiconductor package substrate are formed on the rear of the silicon wafer, and the circuits on the front and rear are electrically connected by "through silicon vias" (TSVs) that penetrate the silicon wafer.

However, silicon interposers, which require wafer-level manufacturing processes, are expensive to manufacture. As a result, silicon interposers are often limited to applications in servers, high-end PCs, high-end graphics, etc., where performance is more important than cost, which is an obstacle to their widespread use.

In addition, since silicon is a semiconductor, forming the wiring layer directly on the silicon wafer results in degradation of electrical characteristics. Furthermore, when semiconductor devices are mounted on a semiconductor package substrate with a silicon interposer, compared to when semiconductor devices are mounted directly on the semiconductor package substrate, the transmission distance from the semiconductor package substrate is longer by the size of the silicon interposer, and noise is easily added.

2.1D semiconductor package substrates have been proposed as a new packaging technique that is less expensive than silicon interposer. A 2.1D semiconductor package substrate is an organic semiconductor package substrate that does not require a silicon interposer by making the multilayer wiring layer on the device mounting side of a conventional organic semiconductor package substrate have a wiring density similar to that of a silicon interposer (for example, see PTL 1).

CITATION LIST

Patent Literature

[PTL 1] Japanese Unexamined Patent Application Publication No. 2020-107681

SUMMARY OF INVENTION

Technical Problem

However, 2.1D semiconductor package substrates present a challenge in that they require the formation of multiple layers of thin-layer fine wiring similar to silicon interposers. For example, 2.1D semiconductor package substrates require thin-layer fine wiring with an L/S of at least 2/2 μm to 5/5 μm and a wiring layer thickness of 3 μm to 10 μm per layer.

In such cases, to form fine wiring using conventional techniques, it is necessary to polish and planarize, by chemical mechanical polishing (CMP), one layer of wiring on the top surface layer of the semiconductor device mounting surface of a semiconductor package substrate manufactured using a normal process by. However, polishing and planarizing by CMP is expensive, and thus difficult to simply apply to the field of semiconductor package substrates.

The semi additive process (SAP) and the modified semi additive process (MSAP) are examples of known technologies for using a plating method to form fine wiring of L/S=2/2 μm to 5/5 μm on mounting substrates, such as semiconductor package substrates, including multilayer wiring layers. However, when fine wiring is formed by SAP or MSAP, the physical stress caused by the roller laminator or the like when thermo-compression bonding the film-like insulating resin, which serves as the interlayer insulating layer, frequently causes the wiring to peel off, making it difficult to manufacture fine wiring with high yield.

Moreover, when the line width of wiring is miniaturized to 2 μm to 5 μm, the thickness of the interlayer insulating layer needs to be reduced from the viewpoint of impedance and fabrication, but when film-like insulating resin is used, either there is no insulating resin with the appropriate thickness, or even if there is, it is difficult to laminate and thermocompress the thin film-like insulating resin.

In view of this, in order to make the thickness of the interlayer insulating layer uniform, the use of liquid insulating resin instead of a film-like insulating resin as the insulating material of the interlayer insulating layer has been considered, but in such cases, it is difficult to maintain a constant thickness of the interlayer insulating layer because the thickness of the interlayer insulating layer, which is formed by curing a liquid insulating resin, is affected by the unevenness of the via electrodes and wiring. In order to mitigate the effect of such unevenness of the via electrodes and wiring, it is conceivable to use filled-via plating, in which plating is selectively deposited as via electrodes and wiring, but it is difficult to form via electrodes and wiring simultaneously by smooth plating due to the diameter of the via electrodes (via holes), width and thickness of the wiring, thickness of the interlayer insulating layer, etc.

Thus, for mounting substrates such as semiconductor package substrates with multilayer wiring layers, it is difficult to form insulating layers with uniform film thickness using conventional manufacturing methods.

Furthermore, in recent years, there has been a demand for higher density mounting substrates such as semiconductor package substrates, but in order to increase the density of mounting substrates, the size (diameter) of via electrodes must be reduced. However, with conventional manufacturing methods, it is difficult to reduce the size of via electrodes for thick interlayer insulating layers. Moreover, as mounting substrates are made denser, it is difficult to precisely align the via electrodes with the wiring, and with conventional manufacturing methods, it is difficult to improve the positioning accuracy between the via electrodes and the wiring.

The present disclosure was conceived to overcome such problems and has an object to provide, for example, a wiring transfer plate that can manufacture wiring bodies and mounting substrates, etc., including an insulating layer with uniform film thickness and small via electrodes, and with high positioning accuracy between the via electrodes and wiring.

Solution to Problem

In order to achieve the above object, in one aspect, a wiring transfer plate according to the present disclosure is for forming wiring to be transferred to another component, and includes: a base; a release layer formed on the base; a transfer plate insulating layer covering the base with an opening above the release layer; and a projecting structure formed on the transfer plate insulating layer, the projecting structure for forming, in an insulating layer of a component to which the wiring is to be transferred, a via hole for a via electrode.

In one aspect, a wiring-equipped wiring transfer plate according to the present disclosure includes the wiring transfer plate described above on which the wiring is formed, and includes: an electroless plating film formed, as the wiring, on the release layer in the opening in the wiring transfer plate.

In one aspect, a wiring body intermediate material according to the present disclosure is an intermediate material for a wiring body disposed above a substrate including a conductor, and includes: an insulating layer located above the substrate and including a recess that is located above the conductor and recessed from a main surface of the insulating layer; and wiring located above the substrate with the insulating layer interposed therebetween.

In one aspect, a method for manufacturing a wiring body according to the present disclosure includes: preparing a substrate including a conductor; preparing the wiring-equipped wiring transfer plate described above; forming an insulating layer between the substrate and the wiring-equipped wiring transfer plate by disposing an insulating material between the substrate and the wiring-equipped wiring transfer plate; and separating the wiring transfer plate included in the wiring-equipped wiring transfer plate from the insulating layer. In the forming of the insulating layer, the projecting structure of the wiring-equipped wiring transfer plate is disposed within the insulating material. By separating the wiring transfer plate, a recess corresponding to the via hole is formed in a portion of the insulating layer on the conductor, and the wiring formed on the wiring-equipped wiring transfer plate is transferred to the insulating layer.

Advantageous Effects of Invention

It is possible to manufacture wiring bodies and mounting substrates, etc., including an insulating layer with uniform film thickness and small via electrodes, and with high positioning accuracy between the via electrodes and wiring.

DESCRIPTION OF EMBODIMENTS

Hereinafter, embodiments of the present disclosure will be described with reference to the drawings. The embodiments described below each illustrate one specific example of the present disclosure. The numerical values, shapes, materials, elements, the arrangement and connection of the elements, etc., shown in the following embodiments are mere examples, and therefore do not limit the scope of the present disclosure. Therefore, among the elements in the following embodiments, those not recited in any of the independent claims defining the broadest concept of the present disclosure are described as optional elements.

Note that the drawings are represented schematically and are not necessarily precise illustrations. Accordingly, the scale, etc., is not necessarily the same in each figure. Additionally, like reference signs indicate like elements. As such, overlapping descriptions of like elements are omitted or simplified.

Embodiment 1

Figure 1:
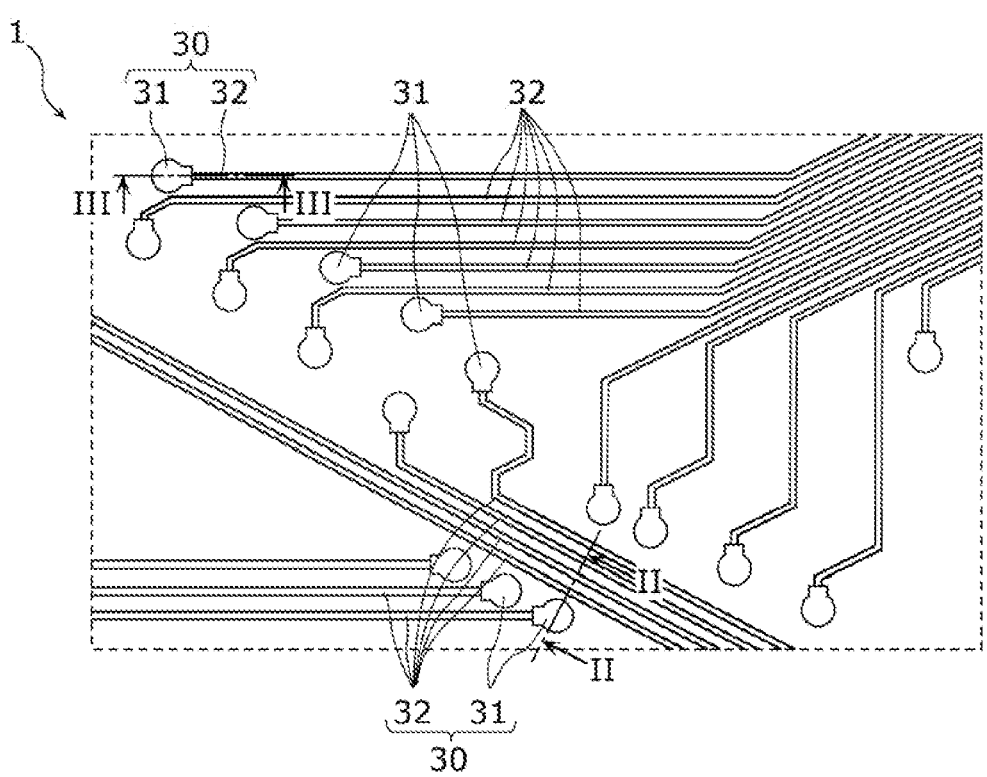
FIG. 1 is a plan view illustrating one example of the wiring pattern of one wiring layer in a wiring body of a mounting substrate according to Embodiment 1.
Figure 2:
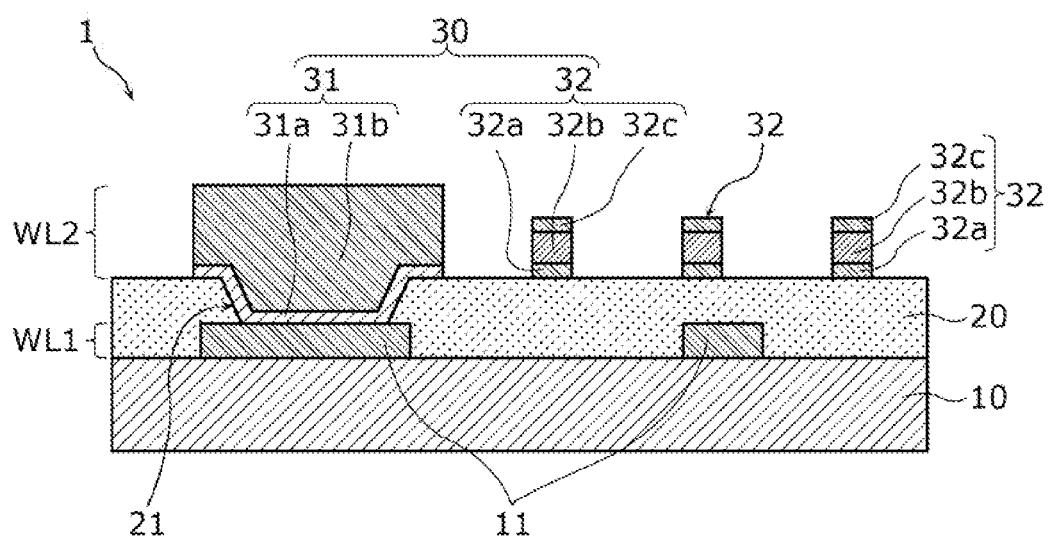
FIG. 2 is a cross-sectional view of wiring between vias on the mounting substrate taken at line II-II in FIG. 1.
Figure 3:
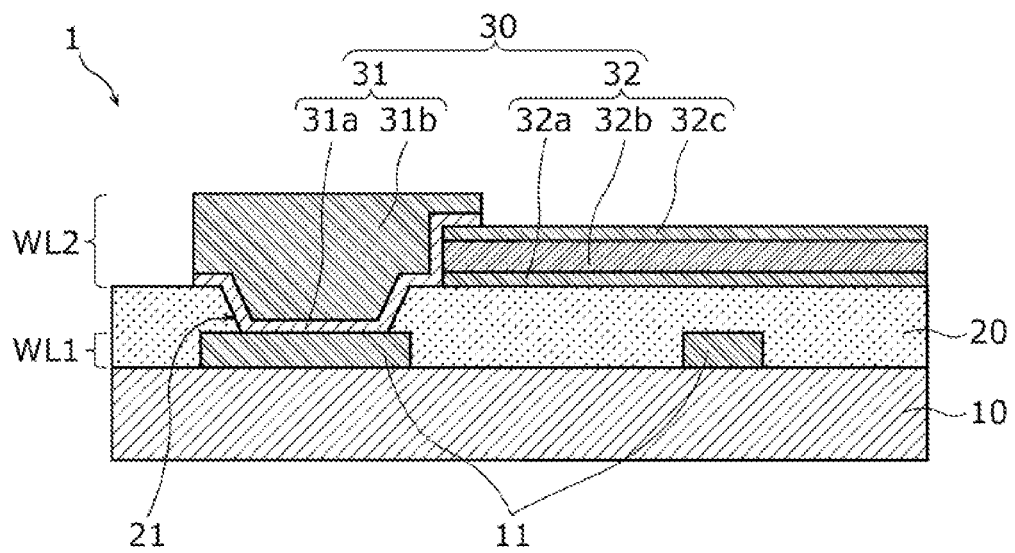
FIG. 3 is a cross-sectional view of a connection between layers on the mounting substrate taken at line III-III in FIG. 1.

First, before describing the wiring transfer plate according to the present disclosure, the configurations of wiring body 30 and mounting substrate 1 manufactured using the wiring transfer plate will be described with reference to FIG. 1 through FIG. 3. FIG. 1 is a plan view illustrating one example of the wiring pattern of one wiring layer in wiring body 30 of mounting substrate 1 according to Embodiment 1. FIG. 2 is a cross-sectional view of wiring between vias on mounting substrate 1 taken at line II-II in FIG. 1. FIG. 3 is a cross-sectional view of a connection between layers on mounting substrate 1 taken at line III-III in FIG. 1.

For example, mounting substrate 1 is a semiconductor package substrate, and includes a plurality of wiring layers in which wiring is formed. Therefore, as illustrated in FIG. 1, mounting substrate 1 includes, as wiring body 30, via electrodes 31 for electrically connecting the wiring between wiring layers, and wiring 32, which is the wiring in one of the wiring layers. Wiring 32 is connected to via electrodes 31. As illustrated in FIG. 1, via electrodes 31 are formed, for example, but not limited to, at the end of the portions where wiring 32 extends. For example, via electrodes 31 may be formed in the middle of wiring 32.

A plurality of via electrodes 31 and a plurality of lines of wiring 32 are formed in each wiring layer. As one example, mounting substrate 1 is a small, ultra-high-density mounting substrate densely provided with wiring 32. Wiring 32 is, for example, fine wiring characterized by L/S=5/5 μm or less. Wiring 32 is therefore formed in a complex wiring pattern so as to pass between two via electrodes 31. In such a configuration, the space between via electrodes (via pitch) is narrow, so lines of wiring 32 are formed at a narrow pitch such that lines of wiring 32 can pass through the narrow space between via electrodes.

As illustrated in FIG. 2 and FIG. 3, mounting substrate 1 includes substrate 10, and insulating layer 20 and wiring body 30 above substrate 10. As described above, wiring body 30 includes at least via electrode 31 and wiring 32 as conductive components. Note that insulating layer 20 may be included in wiring body 30.

Substrate 10 includes conductor 11. Conductor 11 is, for example, wiring or an electrode formed in a different wiring layer than wiring 32. As one example, substrate 10 is a wiring substrate, which is a wiring-equipped substrate including wiring formed with, for example, copper foil, such as a build-up substrate, a multilayer wiring substrate, a double-sided wiring substrate, or a single-sided wiring substrate. Substrate 10 therefore includes a plurality of lines of wiring, etc., as conductors 11 over a single or a plurality of layers. Note that in FIG. 2 and FIG. 3, among conductors 11 included in substrate 10, only conductors 11 formed on the top surface layer of substrate 10 are illustrated for schematic purposes.

In the present embodiment, mounting substrate 1 is an ultra-high-density mounting substrate, and a build-up substrate is used as substrate 10. Substrate 10 is not limited to a wiring substrate such as a build-up substrate, and may be an IC package substrate or an IC chip itself, as long as it includes wiring or electrodes, etc., as conductors 11.

Insulating layer 20 is formed on substrate 10. More specifically, insulating layer 20 covers the entirety of substrate 10 so as to cover conductors 11 on the surface layer of substrate 10.

Insulating layer 20 is disposed between conductors 11 of substrate 10 and wiring 32. Accordingly, insulating layer 20 is an interlayer insulating layer. More specifically, as illustrated in FIG. 2 and FIG. 3, if the wiring layer in which conductors 11, i.e., wiring of the surface layer of substrate 10 is formed is first wiring layer WL1 and the wiring layer in which wiring 32 of wiring body 30 is formed is second wiring layer WL2, insulating layer 20 is an interlayer insulating layer between first wiring layer WL1 and second wiring layer WL2.

Via hole 21 is formed in insulating layer 20. Via hole 21 is a through-hole formed above conductor 11 of substrate 10. Via electrode 31 is formed in via hole 21. Via hole 21 has a truncated cone shape with a sloping (tapered) inner surface. Accordingly, the shape of the opening (the top view shape) of via hole 21 is circular, and the cross-sectional shape of via hole 21 is trapezoidal. Note that via hole 21 may have a polygonal frustum shape, such as a square frustum shape, or a columnar or prismatic shape.

Insulating layer 20 includes an insulating material. The insulating material of insulating layer 20 is, for example, an insulating resin. In such cases, the insulating resin material used to form insulating layer 20 may be a liquid insulating resin material with flowability including a photo-curable resin such as a UV-curable resin or a thermosetting resin, or a prepreg of a film-like insulating resin including a thermosetting resin or a thermoplastic resin. An insulating resin sheet can be used as the film-like insulating resin. In such cases, the insulating resin sheet should have adhesive properties. Note that the insulating material of insulating layer 20 is not limited to organic insulating materials such as insulating resin, and may also be an inorganic insulating material such as silicon oxide film or silicon nitride film.

Wiring body 30 is disposed above substrate 10 including conductors 11. More specifically, via electrodes 31 of wiring body 30 are disposed on conductors 11 of substrate 10, and wiring 32 of wiring body 30 is located above substrate 10 with insulating layer 20 interposed therebetween. More specifically, wiring 32 is disposed on insulating layer 20. As illustrated in FIG. 2, wiring 32 is disposed above conductor 11 functioning as the wiring of substrate 10, with insulating layer 20 interposed therebetween.

As will be described in detail below, wiring 32 is formed on insulating layer 20 by a transfer method using a wiring transfer plate. Note that all of wiring 32 need not be located above the main surface of insulating layer 20; the bottom portion of wiring 32 may be located within insulating layer 20.

Via electrode 31 is connected to conductor 11 of substrate 10 through via hole 21 in insulating layer 20. Via electrode 31 is a plug that connects the top and bottom wiring that sandwiches insulating layer 20. More specifically, via electrode 31 connects the wiring (conductor 11) of first wiring layer WL1 located directly below insulating layer 20 and the wiring (wiring 32) of second wiring layer WL2 located directly above insulating layer 20.

Via electrode 31 is at least partially provided in via hole 21. More specifically, via electrode 31 is seamlessly embedded in via hole 21. Via electrode 31 is formed not only inside via hole 21, but also protrudes out from the main surface of insulating layer 20. The height of via electrode 31 from the main surface of insulating layer 20 is higher than the height of wiring 32 from the main surface of insulating layer 20.

As illustrated in FIG. 2, in the present embodiment, via electrode 31 is formed over conductor 11 of substrate 10 and insulating layer 20. Stated differently, via electrode 31 is formed to ride up from the inside of via hole 21 in insulating layer 20 onto the main surface of insulating layer 20. Accordingly, the plan view surface area of the portion of via electrode 31 protruding out from insulating layer 20 is larger than the surface area of the maximum diameter portion of via electrode 31 embedded in via hole 21.

The shape of the portion of via electrode 31 embedded in via hole 21 is the same as the shape of via hole 21. Therefore, in the present embodiment, the portion of via electrode 31 embedded in via hole 21 has a truncated cone shape with a sloping (tapered) side surface. The minimum diameter of the portion of via electrode 31 embedded in via hole 21 is larger than the width of wiring 32.

Via electrode 31 includes seed layer 31a provided as a lower layer in via electrode 31 and via electrode body layer 31b provided above seed layer 31a. In the present embodiment, seed layer 31a is the lowest layer of via electrode 31.

Seed layer 31a is formed on conductor 11 of substrate 10 in via hole 21. More specifically, seed layer 31a is formed on the top surface of conductor 11 so as to contact conductor 11. Seed layer 31a is formed along the inner side surface of insulating layer 20 from on top of conductor 11 in via hole 21.

In the present embodiment, seed layer 31a is formed up to a location above the main surface of insulating layer 20. Stated differently, seed layer 31a is formed over conductor 11 of substrate 10 and the main surface of insulating layer 20. Seed layer 31a has a constant thickness. Accordingly, seed layer 31a is formed so as to ride up from conductor 11 in via hole 21 onto the main surface of insulating layer 20.

Seed layer 31a is a seed electrode including conductive material for forming via electrode body layer 31b by a plating method. Seed layer 31a should therefore include a conductive material with low electrical resistance. In the present embodiment, seed layer 31a is, for example, a metal film of a metallic material including, for example, copper, which is a low-resistance material. In such cases, seed layer 31a does not include only copper, and may include another metal such as nickel in addition to copper. Seed layer 31a may be a single film including only one metal film, or a multilayer film including a plurality of stacked metal films.

Via electrode body layer 31b is a plating film stacked on seed layer 31a. In the present embodiment, via electrode body layer 31b is an electrolytic plating film formed by an electrolytic plating method. More specifically, via electrode body layer 31b is an electrolytic Cu plating film including copper.

Via electrode body layer 31b is formed so as to be located above seed layer 31a and fill via hole 21. In the present embodiment, via electrode body layer 31b is formed up to a location above insulating layer 20. More specifically, via electrode body layer 31b is formed on seed layer 31a, over conductor 11 and insulating layer 20. Stated differently, via electrode body layer 31b is formed to ride up from the inside of via hole 21 in insulating layer 20 onto the main surface of insulating layer 20.

Via electrode body layer 31b constitutes the majority of via electrode 31. In the present embodiment, via electrode body layer 31b constitutes 90% or more of via electrode 31 in the cross-sectional view of FIG. 2.

Wiring 32 includes adhesion layer 32a provided as a lower layer in wiring 32 and wiring body layer 32b provided on adhesion layer 32a. In the present embodiment, adhesion layer 32a is the lowest layer of wiring 32. Although adhesion layer 32a is exemplified as located within insulating layer 20, adhesion layer 32a may be provided on the main surface of insulating layer 20.

Wiring 32 further includes conductive layer 32c provided on wiring body layer 32b. Stated differently, wiring 32 has a stacked structure in which adhesion layer 32a, wiring body layer 32b, and conductive layer 32c are stacked in this order in the direction leading away from insulating layer 20. In other words, wiring body layer 32b is sandwiched between adhesion layer 32a and conductive layer 32c. The bottom portion of wiring body layer 32b has the same line width as adhesion layer 32a.

Adhesion layer 32a is provided to facilitate adhesion between wiring 32 and insulating layer 20. Stated differently, adhesion layer 32a has a function or structure for enhancing the adhesion between wiring 32 and insulating layer 20. In the present embodiment, adhesion layer 32a has, as a structure for enhancing the adhesion between wiring 32 and insulating layer 20, a fine-textured structure. Although the entire layer of adhesion layer 32a has a fine-textured structure, adhesion layer 32a is not limited to such a configuration; when only a portion of adhesion layer 32a has a fine-textured structure, the fine-textured structure is formed on the side of adhesion layer 32a that faces insulating layer 20. In this way, by providing adhesion layer 32a with a fine-textured structure, adhesion layer 32a can more easily adhere to insulating layer 20 via an anchoring effect.

The fine-textured structure of adhesion layer 32a is, for example, a needle-like uneven shape with a height of 500 nm or less. As one example, adhesion layer 32a includes a metal film containing copper. In such cases, the fine-textured structure of adhesion layer 32a includes copper and/or copper oxide. More specifically, the fine-textured structure can be formed by roughening the copper surface by forming copper oxide with needle-like crystals. Instead of forming copper oxide, micro-roughening etching may be used to roughen the copper surface by slightly etching the surface to form a fine-textured structure. Note that adhesion layer 32a may include metallic elements other than copper.

Wiring body layer 32b is a plating film stacked below conductive layer 32c. In the present embodiment, wiring body layer 32b is an electroless plating film formed by an electroless plating method. More specifically, wiring body layer 32b is an electroless Cu plating film including copper.

Thus, wiring body layer 32b of wiring 32 and via electrode body layer 31b of via electrode 31 are both Cu plating films, but wiring body layer 32b is an electroless Cu plating film and via electrode body layer 31b is an electrolytic Cu plating film. Accordingly, the crystal grain size of the copper included in via electrode body layer 31b and the crystal grain size of the copper included in wiring body layer 32b are different. More specifically, the average crystal grain size of the copper included in via electrode body layer 31b, which is an electrolytic Cu plating film, is larger than the average crystal grain size of the copper included in wiring body layer 32b, which is an electroless plating film. Stated differently, the average crystal grain size of the copper included in wiring body layer 32b, which is an electroless plating film, is smaller than the average crystal grain size of the copper included in via electrode body layer 31b, which is an electrolytic Cu plating film.

Thus, by making via electrode body layer 31b a comparatively low-stress electrolytic plating film, it is possible to inhibit the occurrence of plating peeling and cracks in via electrode 31 due to internal stress. Moreover, by forming an electroless plating film that can provide wiring body layer 32b with a uniform thickness, a plurality of lines of wiring 32 that cover a large surface area and have a uniform thickness can be easily formed.

Moreover, wiring body layer 32b of wiring 32 and via electrode body layer 31b of via electrode 31 are both plating films, but wiring 32 does not include a seed layer as a lower layer. Stated differently, via electrode 31 includes seed layer 31a as a lower layer, but wiring 32 does not include a seed layer as a lower layer.

Wiring body layer 32b of wiring 32 constitutes the majority of wiring 32. In the present embodiment, wiring body layer 32b constitutes 90% or more of wiring 32 in the cross-sectional view of FIG. 2.

Conductive layer 32c formed on top of wiring body layer 32b functions as part of the conductor of wiring 32 and as a protective layer that protects wiring body layer 32b. Stated differently, conductive layer 32c inhibits wiring body layer 32b from being etched and reduced when the seed film is etched and patterned to form seed layer 31a of via electrode 31. Stated differently, wiring body layer 32b can be protected by conductive layer 32c when etching the seed film. Thus, conductive layer 32c functions as a protective layer that protects wiring body layer 32b during etching.

Like wiring body layer 32b, conductive layer 32c is also an electroless plating film. However, conductive layer 32c includes a different material or structure than wiring body layer 32b. In the present embodiment, conductive layer 32c includes a different conductive material than wiring body layer 32b. More specifically, since wiring body layer 32b includes copper, conductive layer 32c includes a conductive material other than copper. For example, conductive layer 32c includes a material containing any of nickel (Ni), palladium (Pd), platinum (Pt), or silver (Ag). Stated differently, conductive layer 32c is an electroless plating film containing any of these materials.

Figure 4:
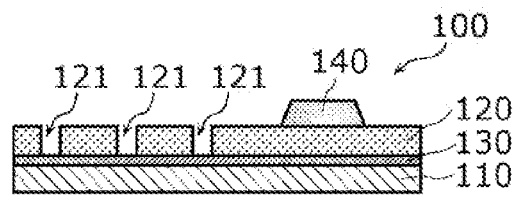
FIG. 4 is a diagram illustrating a method for fabricating a wiring-equipped wiring transfer plate used in manufacturing the wiring body and mounting substrate 1 according to Embodiment 1.
Figure 4:
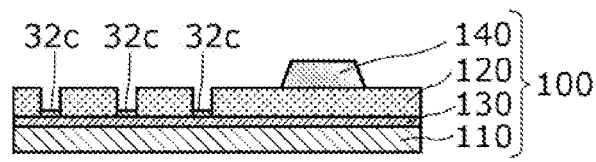
Figure 4:
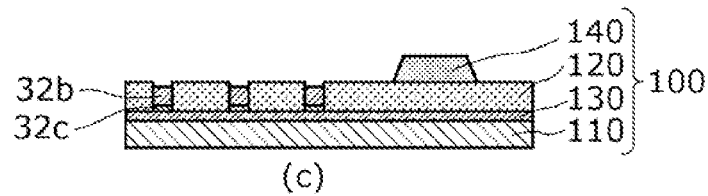
Figure 4:
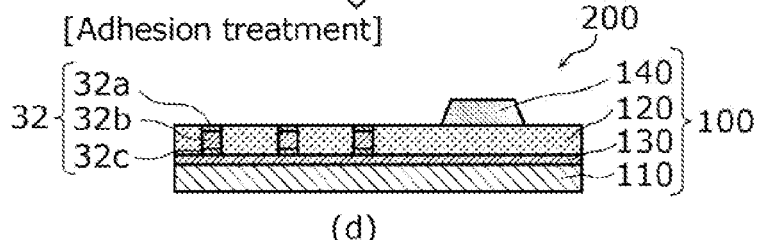
Figure 5:
FIG. 5 is a diagram illustrating a method for fabricating a wiring transfer plate.
Figure 5:
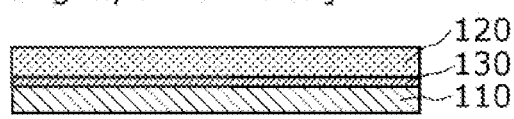
Figure 5:
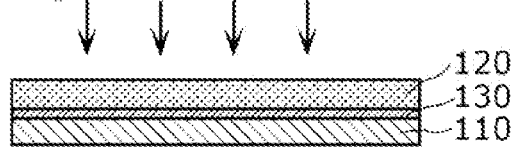
Figure 5:
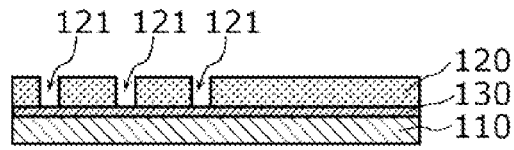
Figure 5:
Figure 5:
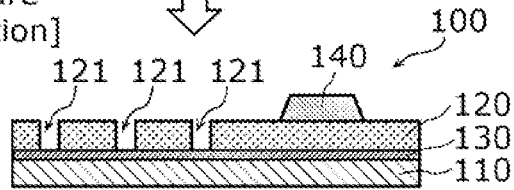
Figure 6A:
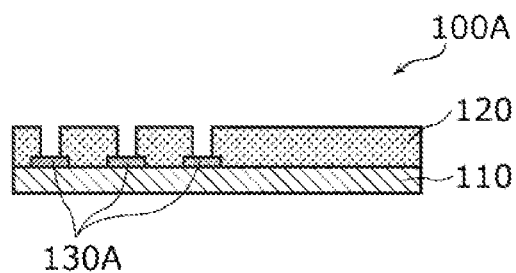
FIG. 6A is a cross-sectional view of a variation of the wiring transfer plate.
Figure 6B:
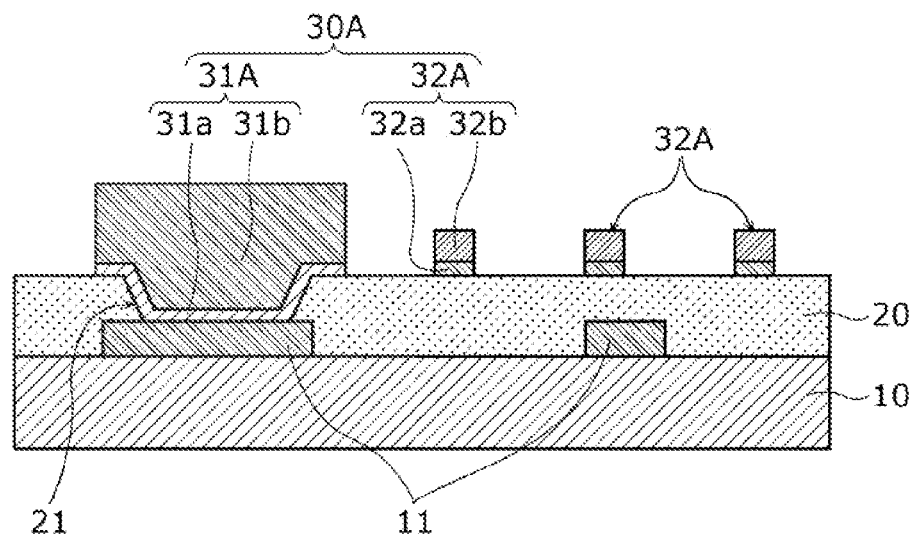
FIG. 6B is a cross-sectional view of wiring between vias on a mounting substrate according to the variation.
Figure 6C:
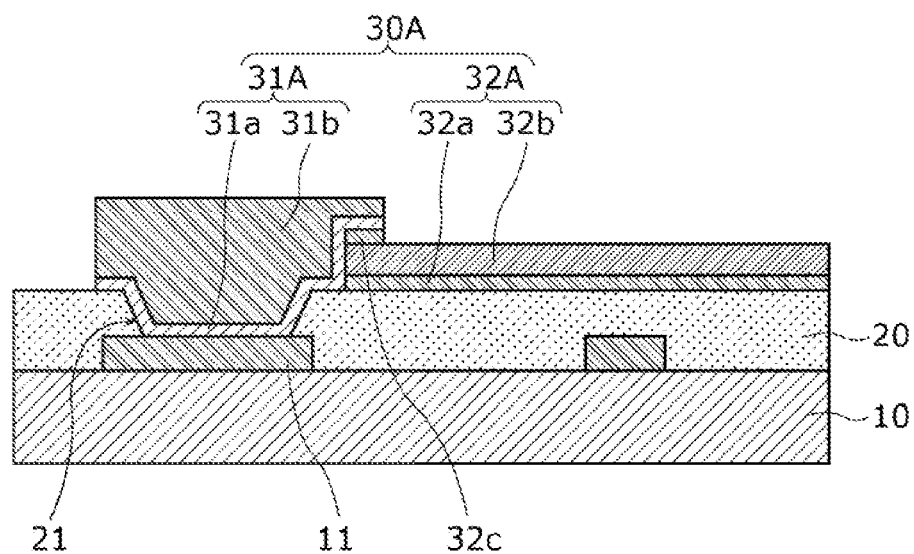
FIG. 6C is a cross-sectional view of a connection between layers on a mounting substrate according to the variation.
Figure 7:
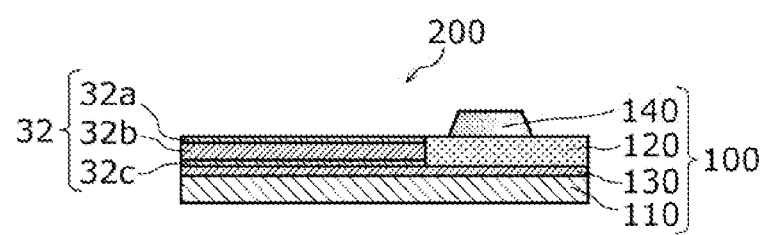
FIG. 7 illustrates the configuration of the wiring-equipped wiring transfer plate fabricated in FIG. 4 when cut in a different cross-section.
Figure 8:
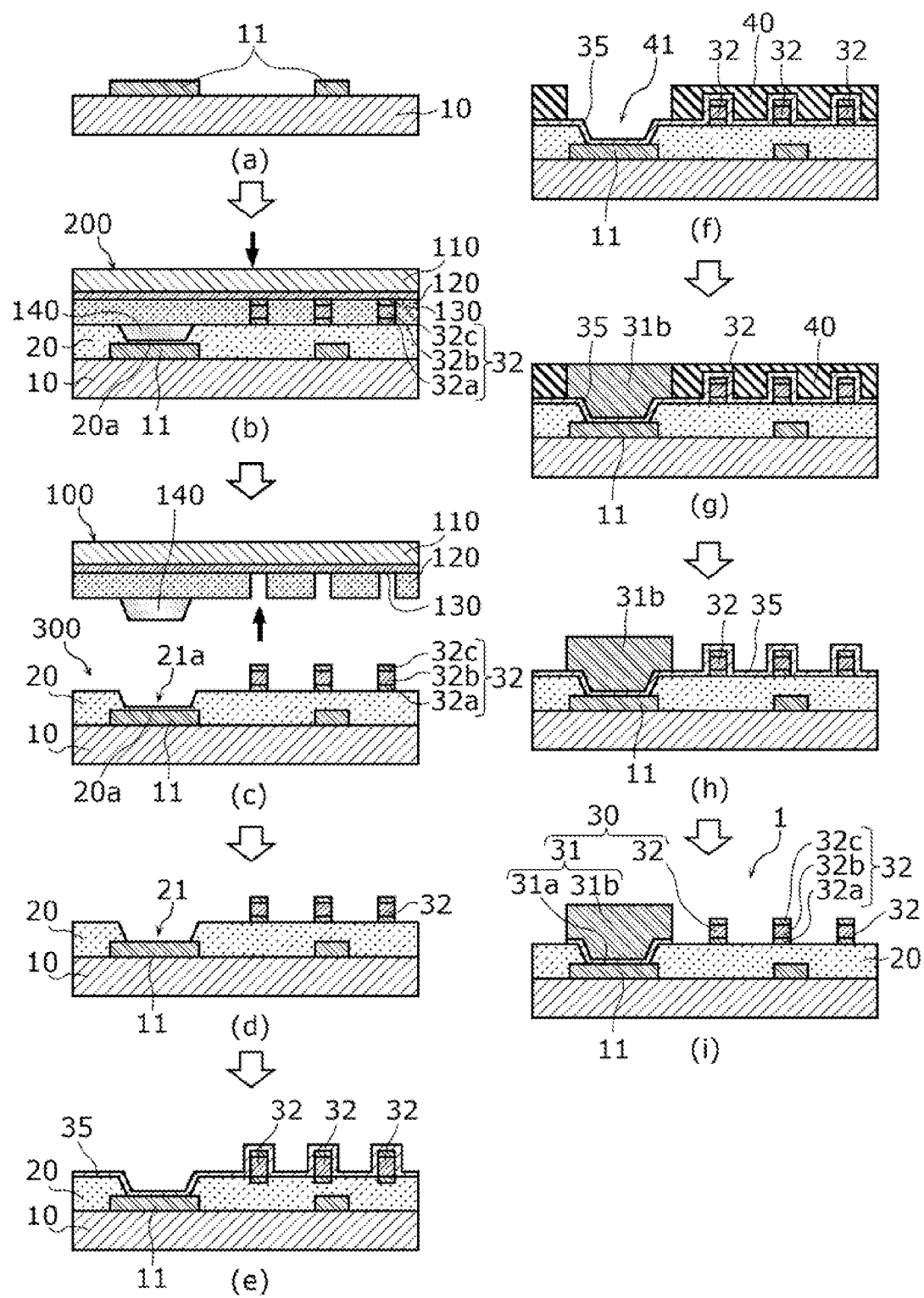
FIG. 8 illustrates a method for manufacturing the wiring body and a method for manufacturing the mounting substrate according to Embodiment 1 (illustrates a cross-sectional view of the portion corresponding to the wiring between vias in FIG. 2).
Figure 9:
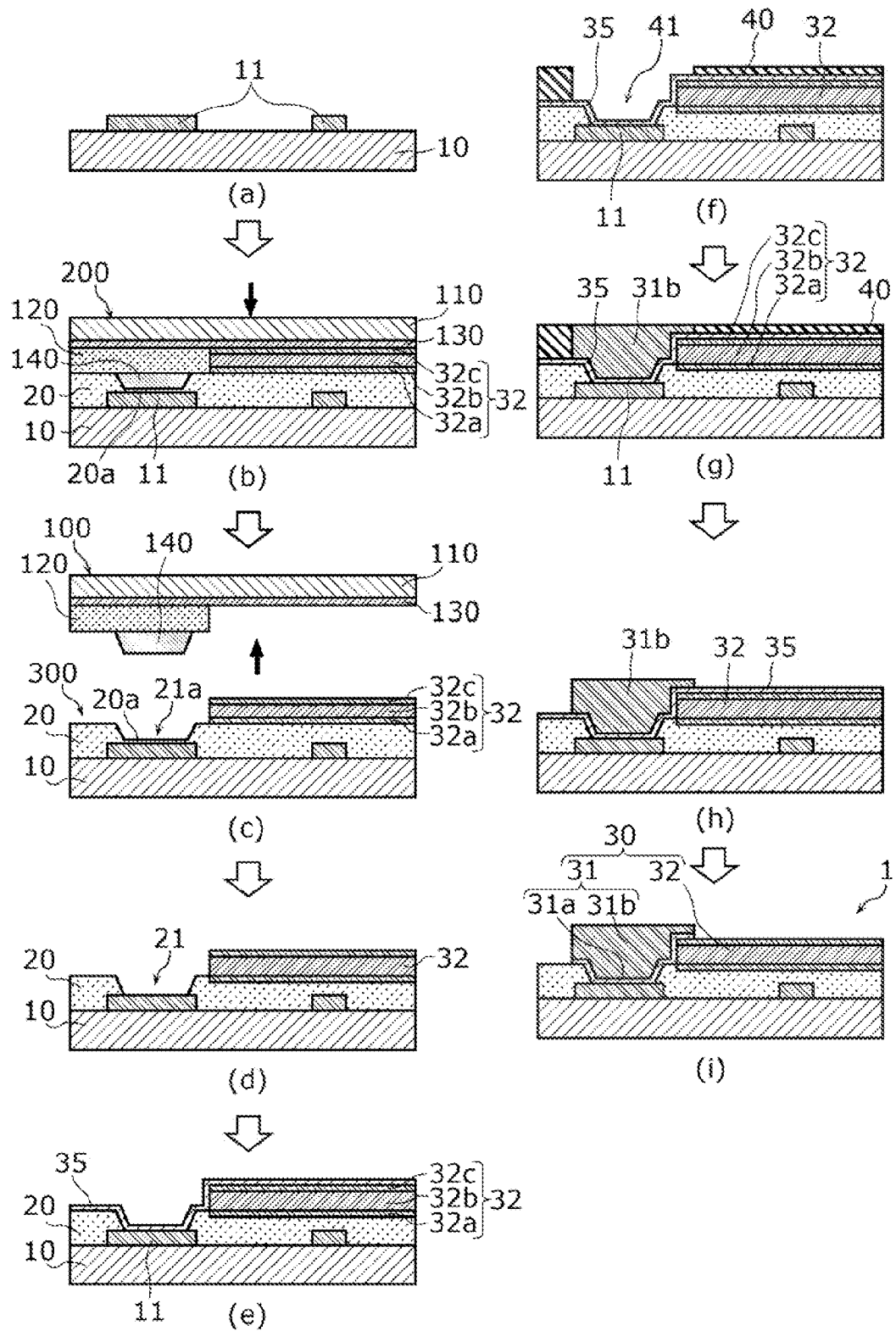
FIG. 9 illustrates a method for manufacturing the wiring body and a method for manufacturing the mounting substrate according to Embodiment 1 (illustrates a cross-sectional view of the portion corresponding to the connection between layers in FIG. 3).

Next, the method for manufacturing wiring body 30 and the method for manufacturing mounting substrate 1 according to the present embodiment will be described with reference to FIG. 4 through FIG. 9. FIG. 4 is a diagram illustrating a method for fabricating wiring-equipped wiring transfer plate 200 used in manufacturing wiring body 30 and mounting substrate 1 according to Embodiment 1. FIG. 5 is a diagram illustrating a method for fabricating wiring transfer plate 100. FIG. 6A is a cross-sectional view of a variation of the wiring transfer plate. FIG. 6B is a cross-sectional view of wiring between vias on a mounting substrate according to the variation. FIG. 6C is a cross-sectional view of a connection between layers on a mounting substrate according to the variation. FIG. 7 illustrates the configuration of wiring-equipped wiring transfer plate 200 fabricated in FIG. 4 when cut in a different cross-section. FIG. 8 and FIG. 9 illustrate the method for manufacturing wiring body 30 and the method for manufacturing mounting substrate 1 according to Embodiment 1. FIG. 8 illustrates the method for manufacturing the portion corresponding to the wiring between vias illustrated in FIG. 2, and FIG. 9 illustrates the method for manufacturing the portion corresponding to the connection between layers illustrated in FIG. 3.

In the present embodiment, wiring body 30 and mounting substrate 1 are fabricated using wiring transfer plate 100. Wiring transfer plate 100 is a wiring pattern plate for forming a predetermined pattern of wiring (transfer wiring) to be transferred to another component (transfer target component). More specifically, wiring transfer plate 100 according to the present embodiment is a pattern plate used in a plating process for forming an electroless plating film as the transfer wiring. The electroless plating film formed by wiring transfer plate 100 becomes at least part of the wiring that is transferred to another component.

Hereinafter, the method for manufacturing wiring body 30 and mounting substrate 1 using wiring transfer plate 100 will be described.

First, as illustrated in FIG. 4, wiring-equipped wiring transfer plate 200 is fabricated in advance using wiring transfer plate 100. Wiring-equipped wiring transfer plate 200 is equivalent to wiring transfer plate 100 on which transfer wiring is formed. In other words, wiring-equipped wiring transfer plate 200 is equivalent to wiring transfer plate 100 in a state in which transfer wiring is formed thereon. Wiring 32 to be transferred to components included in mounting substrate 1 is formed, as transfer wiring, on wiring-equipped wiring transfer plate 200 according to the present embodiment.

More specifically, as illustrated in (a) in FIG. 4, wiring transfer plate 100 is prepared. Wiring transfer plate 100 is fabricated in advance as illustrated in FIG. 5.

Next, the method for fabricating wiring transfer plate 100 will be described with reference to FIG. 5.

First, as illustrated in (a) in FIG. 5, a plating-base-material-equipped base, which includes plating base material layer 130 formed on base 110 that serves as a support substrate, is received. A rigid substrate such as a glass or metal substrate should be used as base 110. In the present embodiment, a SUS metal substrate is used as base 110. Plating base material layer 130 is a catalyst base material layer for forming an electroless plating film. One or more materials selected from nickel (Ni), palladium (Pd), platinum (Pt), chromium (Cr), iron (Fe), etc., can be used as the plating base material included in plating base material layer 130. As one example, plating base material layer 130 is a nickel film.

Then, as illustrated in (b) in FIG. 5, insulating layer 120, which is the transfer plate insulating layer, is formed on top of plating base material layer 130. For example, a photoresist can be used as insulating layer 120.

Then, as illustrated in (c) and (d) in FIG. 5, insulating layer 120, which is a photoresist, is exposed and developed to form a plurality of openings 121 in insulating layer 120 to expose plating base material layer 130. Stated differently, insulating layer 120 covers base 110 including openings 121 above plating base material layer 130.

Then, as illustrated in (e) in FIG. 5, baking is performed.

Then, projecting structure 140 is formed on insulating layer 120, as illustrated in (f) in FIG. 5. More specifically, projecting structure 140 is formed on top of insulating layer 120. This completes wiring transfer plate 100.

Projecting structure 140 formed on insulating layer 120 is a pillar for forming a via hole for a via electrode in the insulating layer of the component (transfer target component) to which the transfer wiring is to be transferred by wiring transfer plate 100. One or more projecting structures 140 are formed depending on the number of via holes to be formed.

Projecting structure 140 is a protrusion formed in a protruding shape so as to project from the main surface of insulating layer 120. As one example, projecting structure 140 is columnar. Since projecting structure 140 is a protrusion for forming a via hole, it has the same shape as the via hole. Stated differently, the via hole will have the same shape as projecting structure 140. In other words, the shape of projecting structure 140 is transferred to the insulating layer as a via hole. In the present embodiment, projecting structure 140 has a truncated cone shape with a sloping (tapered) side surface. Note that projecting structure 140 may have a polygonal frustum shape, such as a square frustum shape, or a columnar or prismatic shape. The side surface of projecting structure 140 does not need to be inclined with respect to the main surface of insulating layer 120, but inclining the side surface of projecting structure 140 makes it easier to pull projecting structure 140 out of the insulating layer of the transfer target component when forming a via hole.

Projecting structure 140 may include either organic or inorganic materials, but should have a high rigidity that will not deform plastically. In the present embodiment, projecting structure 140 includes a resin material having insulating properties. In such cases, projecting structure 140 should include a hard plastic material. Projecting structure 140 may include a resin material having conductive properties, and may include a material other than a resin material. For example, projecting structure 140 may include a metallic material or a ceramic material or the like.

Projecting structure 140 may include the same material as insulating layer 120. In such cases, projecting structure 140 may be formed integrally with insulating layer 120 rather than separately from insulating layer 120. If projecting structure 140 includes the same material as insulating layer 120, projecting structure 140 may be formed when insulating layer 120 is exposed and developed, omitting the process in (f) in FIG. 5.

Note that in wiring transfer plate 100 fabricated in this way, plating base material layer 130 functions as a release layer, but a release treatment may be performed on plating base material layer 130 to provide additional releasing properties. To give plating base material layer 130 releasing properties is to weaken the catalytic reaction effect of plating base material layer 130. For example, plating base material layer 130 exposed from insulating layer 120 can be oxidized to give plating base material layer 130 releasing properties. The release treatment of plating base material layer 130 is not limited to oxidation.

Moreover, in FIG. 5, plating base material layer 130 is a continuous film, but plating base material layer 130 is not limited to this example. For example, as in wiring transfer plate 100A illustrated in FIG. 6A, plating base material layer 130 may be patterned and separated to form plating base material layer 130A per opening 121.

Next, using wiring transfer plate 100 fabricated in this way, wiring 32, which will be the transfer wiring, is formed on wiring transfer plate 100.

More specifically, first, as illustrated in (b) and (c) in FIG. 4, an electroless plating film (electroless plating layer) is formed on plating base material layer 130 by an electroless plating method. For example, an electroless plating film is formed on plating base material layer 130 in openings 121 of insulating layer 120 of wiring transfer plate 100 by depositing and growing metal by catalytic reaction of plating base material layer 130. Here, conductive layer 32c and wiring body layer 32b including different materials are stacked as an electroless plating film on top of plating base material layer 130. In such cases, in the present embodiment, since plating base material layer 130 is a nickel film, conductive layer 32c including an electroless Ni plating film, an electroless silver plating film, an electroless Pt plating film, or an electroless pd plating film is formed on plating base material layer 130, and wiring body layer 32b including an electroless Cu plating film is stacked on conductive layer 32c. Conductive layer 32c is preferably an electroless plating film. By making conductive layer 32c an electroless plating film, conductive layer 32c can be formed thin and uniform in thickness. However, conductive layer 32c may be an electrolytic plating film instead of an electroless plating film.

Note that when conductive layer 32c is an electroless Ni film or an electroless silver plating film, since the electroless Ni film or the electroless silver plating film can be removed with almost no erosion of Cu when making the wiring body in a later process, the wiring body can be easily structured only of Cu. If electroless Ni film remains, there is concern that the wiring resistance of the wiring body will increase because the electroless Ni film generally includes substances such as boron and phosphorus, which have high resistance. There is also concern that the high-frequency characteristics, etc., will be degraded due to the electroless Ni film being magnetic. In addition, there is concern that reliability characteristics may be degraded because silver is a metal that is prone to ion migration. Therefore, if conductive layer 32c is an electroless Ni film or an electroless silver plating film, conductive layer 32c may be removed. In such cases, regarding wiring body 30A of the mounting substrate according to the variation where conductive layer 32c is removed, a cross-sectional view of wiring between vias in the mounting substrate corresponding to line II-II in FIG. 1 is illustrated in FIG. 6B, and a cross-sectional view of the connection between layers in the mounting substrate corresponding to line III-III in FIG. 1 is FIG. 6C. As illustrated in FIG. 6B, although conductive layer 32c will remain in the connection area between via electrode 31A and wiring 32A, if an electroless Ni film or an electroless silver plating film is used as conductive layer 32c, good connection characteristics can be obtained between seed layer 31a, which will be an electroless Cu film, and the electroless Ni film or the electroless silver plating film.

However, when conductive layer 32c is an electroless Pd film or an electroless Pt film, since the electroless Pd film or the electroless Pt film generally contains few impurities, the surface resistance of the wiring can be kept low, and it is also advantageous in regard to high-frequency characteristics because it is not magnetic. Moreover, the Pd or Pt included in the electroless Pd or the electroless Pt film is a stable metal compared to Cu, so it can also function as a barrier layer to inhibit ion migration.

As described in Embodiment 2 below, depending on the material of plating base material layer 130, it is possible to form only wiring body layer 32b including an electroless Cu plating film, without forming conductive layer 32c. Stated differently, at least wiring body layer 32b should be formed on plating base material layer 130. Conductive layer 32c is preferably an electroless plating film. By making conductive layer 32c an electroless plating film, conductive layer 32c can be formed uniform in thickness. However, conductive layer 32c may be an electrolytic plating film instead of an electroless plating film.

Next, as illustrated in (d) in FIG. 4, an adhesion treatment is performed to give adhesive properties to the surface layer of wiring body layer 32b exposed from insulating layer 120. By giving wiring body layer 32b adhesive properties, the surface layer of wiring body layer 32b becomes adhesion layer 32a. For example, by roughening wiring body layer 32b exposed from insulating layer 120, the surface layer of wiring body layer 32b can be turned into adhesion layer 32a including a fine-textured structure. This completes wiring-equipped wiring transfer plate 200 including wiring 32 formed on wiring transfer plate 100, as illustrated in (d) in FIG. 4. In the area of the connection between layers, wiring-equipped wiring transfer plate 200 has the structure illustrated in FIG. 7.

Wiring-equipped wiring transfer plate 200 fabricated in this way allows wiring 32 to be transferred to other components. Stated differently, conductive layer 32c and wiring body layer 32b, which are electroless plating films, and adhesion layer 32a constitute wiring 32, which is transfer wiring to be transferred to another component.

Note that wiring transfer plate 100 after transferring wiring 32 of wiring-equipped wiring transfer plate 200 to another component returns to the state illustrated in (a) in FIG. 4, and can be used repeatedly. Stated differently, wiring transfer plate 100 can be reused. More specifically, as illustrated in (b) through (d) in FIG. 4, an electroless plating film is deposited on wiring transfer plate 100 to once again form wiring 32, which can then be transferred to another component.

In the present embodiment, wiring-equipped wiring transfer plate 200 is used to fabricate wiring body 30 and mounting substrate 1. This will be described next with reference to FIG. 8, which illustrates a cross-section of wiring between vias of mounting substrate 1, and FIG. 9, which illustrates a cross-section of a connection between layers of mounting substrate 1.

First, as illustrated in (a) through (c) in FIG. 8 and (a) through (c) in FIG. 9, wiring 32 is disposed above substrate 10 with insulating layer 20 interposed therebetween. In the present embodiment, wiring 32 is formed by a transfer method using wiring-equipped wiring transfer plate 200 that is prepared in advance.

More specifically, as illustrated in (a) in FIG. 8 and (a) in FIG. 9, substrate 10 including conductor 11 is prepared. For example, as substrate 10, a build-up substrate with wiring and electrodes, etc., formed as conductor 11 on the top layer is prepared.

Next, as illustrated in (b) in FIG. 8 and (b) in FIG. 9, an insulating material is disposed between substrate 10 including conductor 11 and wiring-equipped wiring transfer plate 200 to form insulating layer 20 between substrate 10 and wiring-equipped wiring transfer plate 200.

More specifically, an insulating material that will become insulating layer 20 is disposed on substrate 10 including conductor 11, and wiring-equipped wiring transfer plate 200 is placed on top of the insulating material. Stated differently, the insulating material of insulating layer 20 is inserted between substrate 10 and wiring-equipped wiring transfer plate 200. Here, wiring-equipped wiring transfer plate 200 is arranged so that the exposed wiring 32 and projecting structure 140 are on the insulating layer 20 side. In such cases, projecting structure 140 is disposed so as to oppose conductor 11 that connects the via electrode.

For example, when a fluid liquid insulating resin material is used as the insulating material for insulating layer 20, the liquid insulating resin material is applied on substrate 10 including conductor 11, and wiring-equipped wiring transfer plate 200 is disposed on top thereof and the liquid insulating resin material is cured. If the liquid insulating resin material is a thermosetting resin, it is cured by heating or drying, and if the liquid insulating resin material is a photo-curable resin, it is cured by light irradiation. This allows insulating layer 20 to be formed between substrate 10 and wiring-equipped wiring transfer plate 200, with projecting structure 140 is embedded in insulating layer 20.

When a film-like insulating resin sheet is used as the insulating material for insulating layer 20, the film-like insulating resin sheet is disposed on substrate 10 including conductor 11, and wiring-equipped wiring transfer plate 200 is disposed on top thereof and thermocompression bonded. Here, since wiring-equipped wiring transfer plate 200 is pressed toward substrate 10, the portion of the insulating resin sheet that corresponds to projecting structure 140 is pushed and spread by projecting structure 140. This allows insulating layer 20 to be formed between substrate 10 and wiring-equipped wiring transfer plate 200, with projecting structure 140 is embedded in insulating layer 20.

In this process, projecting structure 140 of wiring-equipped wiring transfer plate 200 is disposed within the insulating material. In such cases, projecting structure 140 is disposed within the insulating material such that the leading end portion of projecting structure 140 is in contact with conductor 11. With this, projecting structure 140 is embedded in insulating layer 20 while its leading end portion is in contact with or in close proximity to conductor 11. However, ultra-thin insulating thin film 20a may be present in part or all of the space between projecting structure 140 and conductor 11.

Next, as illustrated in (c) in FIG. 8 and (c) in FIG. 9, wiring transfer plate 100 included in wiring-equipped wiring transfer plate 200 is separated from insulating layer 20. Stated differently, wiring transfer plate 100 is separated from insulating layer 20. This transfers wiring 32 of wiring-equipped wiring transfer plate 200 to the substrate 10 side, away from plating base material layer 130 (the release layer). More specifically, wiring 32 of wiring-equipped wiring transfer plate 200 is transferred to insulating layer 20, thereby forming wiring 32 on insulating layer 20. In the present embodiment, conductive layer 32c, wiring body layer 32b, and adhesion layer 32a are transferred to insulating layer 20.

By separating wiring transfer plate 100 including projecting structure 140 from insulating layer 20, recess 21a corresponding to via hole 21 is formed in insulating layer 20 above conductor 11, in the portion of insulating layer 20 where projecting structure 140 was embedded. Recess 21a is located above conductor 11 and recessed from the main surface of insulating layer 20.

Thus, by separating wiring transfer plate 100, recess 21a corresponding to via hole 21 is formed in the portion of insulating layer 20 above conductor 11, and wiring 32 formed in wiring-equipped wiring transfer plate 200 is transferred to insulating layer 20.

In the present embodiment, wiring 32 is easily separated from plating base material layer 130 of wiring transfer plate 100 because plating base material layer 130 has releasing properties, and adhesion layer 32a easily adheres to insulating layer 20 because adhesion layer 32a is formed on wiring 32 via an adhesion treatment. This allows wiring 32 to be easily transferred to insulating layer 20.

Thus, the component to which wiring 32 is transferred by wiring-equipped wiring transfer plate 200 and in which recess 21a is formed in insulating layer 20 is wiring body intermediate material 300, which is an intermediate material for wiring body 30 disposed above substrate 10. Thus, wiring body intermediate material 300 includes: insulating layer 20 located above substrate 10 and including recess 21a above conductor 11; and wiring 32 provided above substrate 10 with insulating layer 20 interposed therebetween. Wiring body intermediate material 300 according to the present embodiment is formed using wiring-equipped wiring transfer plate 200, and recess 21a is formed by projecting structure 140 in wiring-equipped wiring transfer plate 200.

Next, as illustrated in (d) in FIG. 8 and (d) in FIG. 9, a residue removal process is performed to remove the residue of the insulating material of insulating layer 20. For example, insulating thin film 20a that remains as a residue of the insulating material of insulating layer on top of conductor 11 is removed. This residue of the insulating material may be removed by laser patterning or by dry or wet ashing.

This residue removal process exposes the surface of conductor 11 of substrate 10. Note that a component that has undergone this residue removal process may be used as wiring body intermediate material 300.

Next, as illustrated in (e) in FIG. 8 and (e) in FIG. 9, seed film is formed so as to cover exposed conductor 11 and wiring 32. Seed film 35 is also stacked on exposed insulating layer 20. Seed film 35 covering conductor 11 is a seed electrode for forming via electrode body layer 31b of via electrode 31 by an electrolytic plating method, but by covering not only conductor 11 but also wiring 32 with this seed film 35, wiring 32 can be protected by seed film 35 until seed film 35 is removed in a subsequent process. Note that seed film covers not only the top of wiring 32 but also the sides of wiring 32. Therefore, a small amount of seed film 35 components (Pd, etc.) will be present on the top and sides of wiring 32.

More specifically, after desmearing and removing the residue of insulating layer 20 by laser treatment, seed film 35 is formed over the entire upper surface of substrate 10 by an electroless plating method or sputtering. Therefore, seed film 35 is formed not only on the exposed surfaces of conductor 11 and wiring 32, but also on the exposed surface of exposed insulating layer 20.

Note that in the present embodiment, seed film 35 is, for example, a metal film of a metallic material including copper. In such cases, seed film 35 may include only copper, and, alternatively, may include copper and another metal such as nickel.

Next, as illustrated in (f) in FIG. 8 and (f) in FIG. 9, resist 40 is selectively formed on the portion of seed film 35 covering wiring 32 so as to expose the portion of seed film 35 covering conductor 11. More specifically, opening 41 is formed in resist 40 above conductor 11. For example, dry film resist (DFR) can be used as resist 40.

Next, as illustrated in (g) in FIG. 8 and (g) in FIG. 9, via electrode body layer 31b is formed on the exposed seed film 35. More specifically, via electrode body layer 31b is formed so as to fill opening 41 in resist 40. In the present embodiment, as via electrode body layer 31b, an electrolytic plating film is formed on seed film 35 in opening 41 via an electrolytic plating method. As one example, via electrode body layer 31b is an electrolytic Cu plating film.

As illustrated in (g) in FIG. 9, in the area of the connection between layers, a portion of via electrode body layer 31b is formed so as to ride up over the edge of wiring 32. More specifically, a portion of via electrode body layer 31b is formed on seed film 35 stacked on wiring 32.

Next, as illustrated in (h) in FIG. 8 and (h) in FIG. 9, resist 40 is removed. More specifically, resist 40, which is dry film resist, is peeled off. This exposes the portion of seed film 35 that was covered by resist 40.

Next, as illustrated in (i) in FIG. 8 and (i) in FIG. 9, the portion of seed film 35 covering wiring 32 is removed. More specifically, exposed seed film 35 is removed by etching using an etchant. At this time, since seed film 35 and conductive layer 32c of wiring 32 include different conductive materials, seed film 35 can be selectively etched without etching conductive layer 32c. This inhibits the line width of the lower layer of wiring 32 from decreasing since it inhibits the undercutting of the lower layer of wiring 32 by this etching.

By etching seed film 35 in this way, only seed film 35 under via electrode body layer 31b remains, and this seed film 35 becomes seed layer 31a, which makes it possible to form via electrode 31 in which seed layer 31a and via electrode body layer 31b are stacked.

In this way, wiring body 30 including via electrode 31 and wiring 32 is formed and mounting substrate 1 including wiring body can be fabricated. Stated differently, it is possible to fabricate wiring body 30 on substrate 10 including conductor 11 and also to fabricate mounting substrate 1 including wiring body 30 disposed above substrate 10.

In this way, in the present embodiment, wiring 32 of wiring body 30 is formed by a transfer method. More specifically, wiring 32 is formed using wiring transfer plate 100.

This allows fine wiring 32 to be formed with high precision even if the surface (transfer target surface) of substrate 10, which is the transfer target component, has unevenness due to, for example, wiring or electrodes. Stated differently, when wiring is formed by a photolithography method, if there is unevenness on the surface of the portion where wiring is formed, the focus is shifted and fine wiring cannot be formed precisely. However, by forming and transferring wiring 32 using wiring transfer plate 100 like in the present embodiment, even if the surface of the area where wiring 32 has unevenness, i.e., is not flat, the effect that unevenness has can be reduced and fine wiring 32 can be formed with high precision. Moreover, by using a rigid glass substrate or a metal plate as base 110 of the wiring transfer plate, wiring 32 can be formed with high positioning accuracy.

In the present embodiment, when manufacturing wiring body and mounting substrate 1 using wiring transfer plate 100, wiring-equipped wiring transfer plate 200, in which wiring 32 is formed on wiring transfer plate 100, is used. In such cases, wiring-equipped wiring transfer plate 200 includes, as wiring 32, an electroless plating film formed on plating base material layer 130 (release layer) in wiring transfer plate 100.

The method for manufacturing wiring body 30 according to the present embodiment includes: preparing substrate 10 including conductor 11; preparing wiring-equipped wiring transfer plate 200; forming insulating layer 20 between substrate 10 and wiring-equipped wiring transfer plate 200 by disposing an insulating material between substrate 10 and wiring-equipped wiring transfer plate 200; and separating wiring transfer plate 100 included in wiring-equipped wiring transfer plate 200 from insulating layer 20. In the forming of insulating layer 20, projecting structure 140 of wiring-equipped wiring transfer plate 200 is disposed within insulating material 20. By separating wiring transfer plate 100, recess 21a corresponding to via hole 21 is formed in a portion of insulating layer 20 on conductor 11, and wiring 32 formed on wiring-equipped wiring transfer plate 200 is transferred to insulating layer 20.

In this case, wiring transfer plate 100 used in the present embodiment includes: base 110; plating base material layer 130 (a release layer) formed on base 110; insulating layer 120 (a transfer plate insulating layer) covering base 110 with opening 121 above plating base material layer 130; and projecting structure 140, formed on insulating layer 120, for forming, in insulating layer 20 of a component (a transfer target component) to which wiring 32 is to be transferred, via hole 21 for via electrode 31.

In this way, since wiring transfer plate 100 according to the present embodiment includes projecting structure 140, it is possible to form recess 21a for via electrode 31 and wiring 32 on substrate 10 simultaneously, by manufacturing wiring body 30 and mounting substrate 1 using wiring-equipped wiring transfer plate 200 in which wiring 32 is formed on wiring transfer plate 100. More specifically, recess 21a for via electrode 31 and wiring 32 can be simultaneously transferred to wiring body 30 as the transfer target component or to insulating layer 20 of mounting substrate 1 as the transfer target component. By forming recess 21a corresponding to via hole 21 in insulating layer 20 using projecting structure 140, the film thickness of insulating layer 20 can be made uniform. In such cases, the size of via electrode 31 can be reduced by forming recess 21a in insulating layer 20 because the thickness of insulating layer 20 for removal is reduced. Furthermore, by forming recess 21a for via electrode 31 and wiring 32 simultaneously, the number of processes can be reduced and the positioning accuracy between via electrodes 31 and wiring 32 can be improved.

In this way, by using wiring transfer plate 100 according to the present embodiment, it is possible to manufacture wiring body 30 and mounting substrate 1 including insulating layer 20 with uniform film thickness and small via electrodes 31, and with high positioning accuracy between via electrodes 31 and wiring 32.

The line width of wiring 32 according to the present embodiment should be 5 μm or less, and more preferably 2 μm or less. By making wiring 32 fine wiring as described above, it is possible to pass a large number of lines of fine wiring between vias, enabling high-density mounting with a small number of wiring layers. Furthermore, variation in the thickness of wiring 32 according to the present embodiment is less than ±10% or ±1 μm. By forming wiring 32, which is fine wiring with such thickness variation, it is possible to inhibit variation in characteristic impedance.

Wiring body 30 fabricated in this way can be used as a wiring layer or redistribution layer (RDL) in a semiconductor package substrate.

Figure 10:
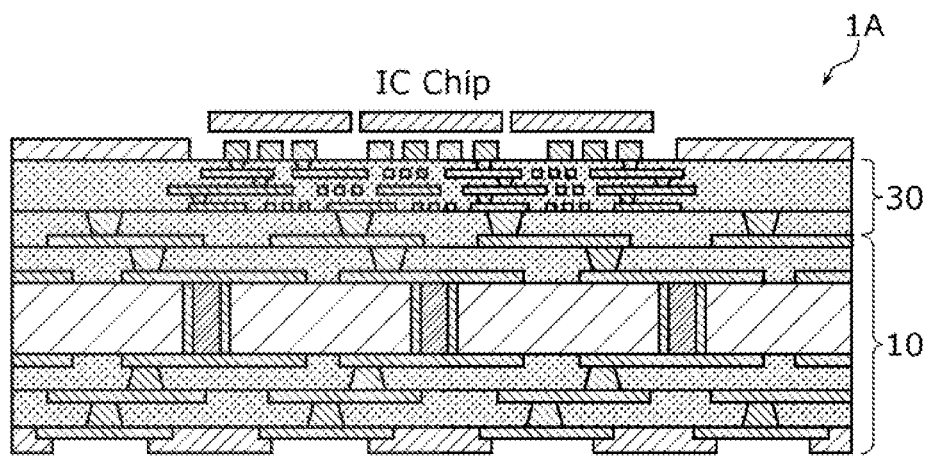
FIG. 10 is a cross-sectional view of mounting substrate according to Embodiment 1, showing a first wiring body application example.
Figure 11:
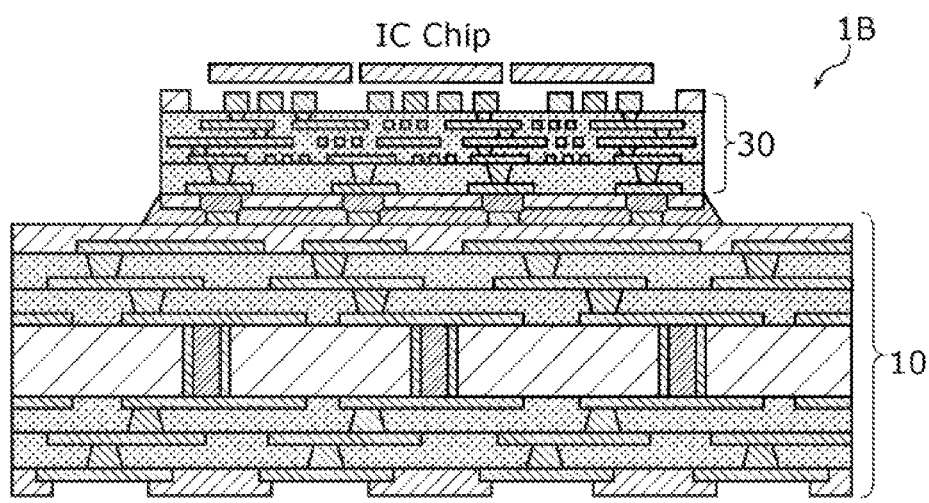
FIG. 11 is a cross-sectional view of mounting substrate according to Embodiment 1, showing a second wiring body application example.

For example, as illustrated in FIG. 10, wiring body 30 can be used as a redistribution layer in mounting substrate 1A, which is a 2.1D semiconductor package substrate (organic interposer), and as illustrated in FIG. 11, wiring body 30 can be used as a redistribution layer in mounting substrate 1B, which is a 2.3D semiconductor package substrate (organic interposer). In FIG. 10 and FIG. 11, substrate 10 is a build-up substrate.

Figure 12:
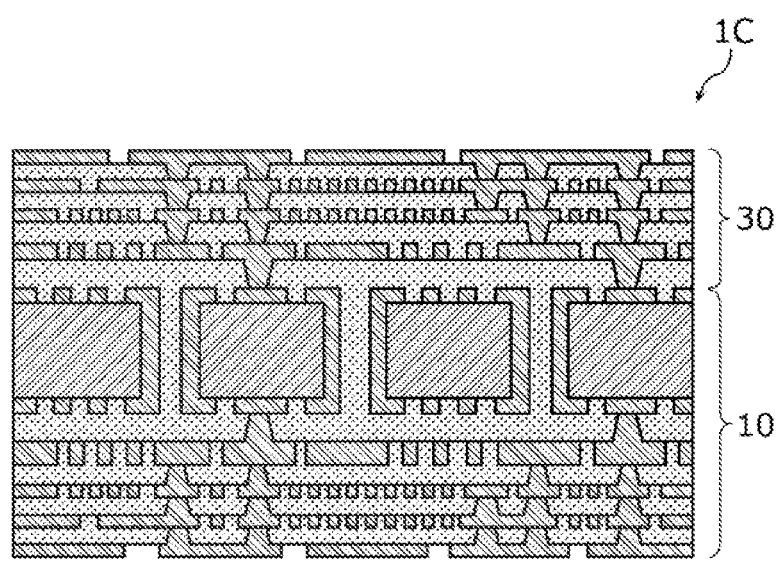
FIG. 12 is a cross-sectional view of mounting substrate according to Embodiment 1, showing a third wiring body application example.

As illustrated in FIG. 12, wiring body 30 can be used as a redistribution layer in mounting substrate 1C, which is a 2.5D semiconductor package substrate (Si or glass interposer).

As another example, wiring body 30 can be used as a redistribution layer in a mounting substrate that is a Fan Out-Wafer Level Package (FO-WLP).

Mounting substrates 1A, 1B, and 1C illustrated in FIG. 10 through FIG. 12 can also be applied to Embodiments 2 and 3 below.

Moreover, wiring body 30 can also be applied to a build-up layer (wiring layer) of a typical build-up substrate, rather than the redistribution layer. For example, wiring body 30 can be applied to the wiring layer of substrate 10, which is the build-up substrate illustrated in FIG. 11 through FIG. 13. As a result, it is possible to realize an embodiment in which fine wiring 32 of 5 μm or less, which was conventionally difficult, is formed, whereby a semiconductor package substrate that does not require an interposer or redistribution layer can be obtained. Furthermore, such a structure improves electrical characteristics because the wiring distance from electronic components formed in the core, such as inductors or capacitors, to the semiconductors is shortened, and also eliminates the need for an interposer or a redistribution layer, resulting in an inexpensive semiconductor package.

Embodiment 2

Figure 13:
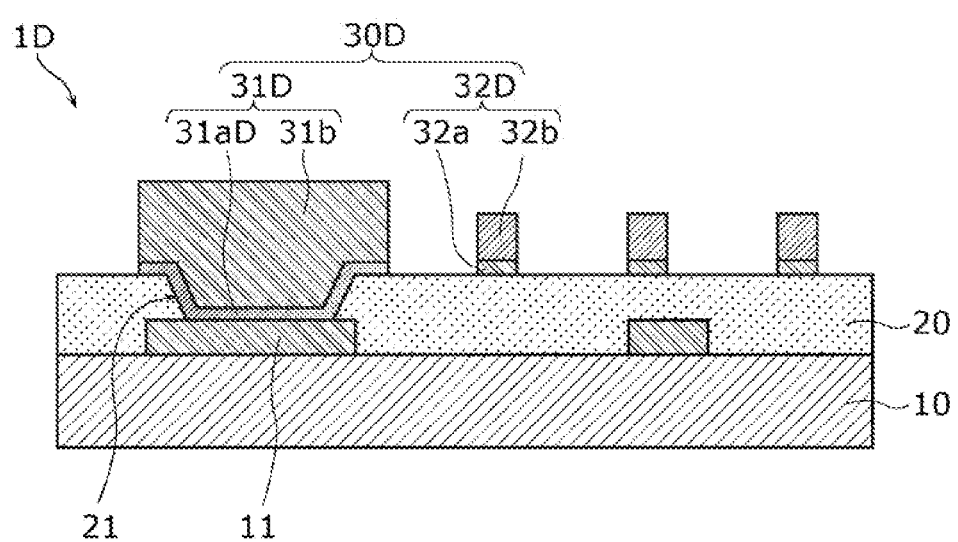
FIG. 13 is a cross-sectional view of a mounting substrate according to Embodiment 2.

Next, the configurations of wiring body 30D and mounting substrate 1D according to Embodiment 2 will be described with reference to FIG. 13. FIG. 13 is a cross-sectional view of mounting substrate 1D according to Embodiment 2.

In wiring 32 in Embodiment 1 described above, conductive layer 32c is formed on top of wiring body layer 32b, but as illustrated in FIG. 13, wiring 32D, which is included in wiring body 30D and mounting substrate 1D according to the present embodiment, does not include conductive layer 32c on top of wiring body layer 32b. More specifically, wiring 32D includes only adhesion layer 32a and wiring body layer 32b.

In wiring body 30 and mounting substrate 1 in Embodiment 1 described above, seed layer 31a of via electrode 31 and wiring body layer 32b of wiring 32 included the same metal, but in wiring body 30D and mounting substrate 1D according to the present embodiment, seed layer 31aD of via electrode 31D and wiring body layer 32b of wiring 32D include different types of metals. More specifically, in Embodiment 1 described above, both seed layer 31a and wiring body layer 32b are metal films including copper, but in the present embodiment, wiring body layer 32b is a metal film including only copper, while seed layer 31aD is a metal film including a metal other than copper. Stated differently, in the present embodiment, wiring body layer 32b of wiring 32D is the same as in Embodiment 1 described above, but seed layer 31aD of via electrode 31D includes a metal other than copper, unlike in Embodiment 1 described above.

Note that wiring body 30D and mounting substrate 1D according to the present embodiment are the same as wiring body 30 and mounting substrate 1 according to Embodiment 1 described above except that wiring 32D does not include conductive layer 32c and that seed layer 31aD and wiring body layer 32b include different types of metals.

Figure 14:
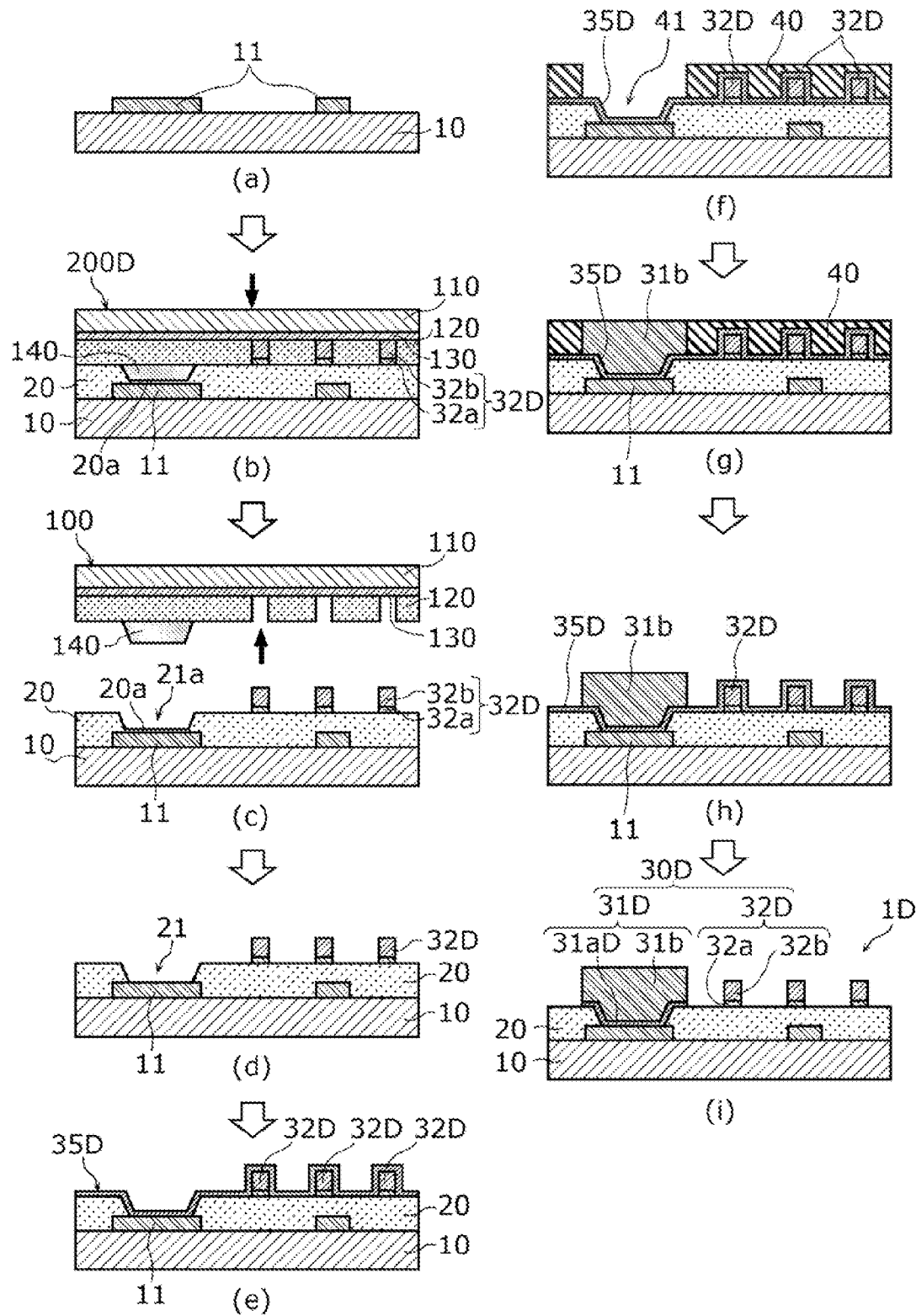
FIG. 14 illustrates a method for manufacturing a wiring body and a method for manufacturing the mounting substrate according to Embodiment 2.

Wiring body 30D and mounting substrate 1D configured as described above are manufactured by the method illustrated in FIG. 14. FIG. 14 illustrates the method for manufacturing wiring body 30D and the method for manufacturing mounting substrate 1D according to Embodiment 2.

Wiring-equipped wiring transfer plate 200D, in which wiring 32D is formed on wiring transfer plate 100 including projecting structure 140, is also used in the present embodiment as well. Stated differently, in the present embodiment as well, wiring 32D is formed by a transfer method using wiring-equipped wiring transfer plate 200D that is prepared in advance. However, in wiring-equipped wiring transfer plate 200D, wiring 32D does not include conductive layer 32c. More specifically, wiring 32D includes wiring body layer 32b and adhesion layer 32a.

First, as illustrated in (a) through (c) in FIG. 14, wiring 32D is disposed above substrate 10 with insulating layer 20 interposed therebetween.

More specifically, as illustrated in (a) in FIG. 14, substrate 10 including conductor 11 is prepared, just as in the process illustrated in (a) in FIG. 8.

Next, as illustrated in (b) in FIG. 14, just as in the process illustrated in (b) in FIG. 8, an insulating material is disposed between substrate 10 including conductor 11 and wiring-equipped wiring transfer plate 200D to form insulating layer 20 between substrate 10 and wiring-equipped wiring transfer plate 200D.

Next, as illustrated in (c) in FIG. 14, just as in the process illustrated in (c) in FIG. 8, wiring transfer plate 100 included in wiring-equipped wiring transfer plate 200D is separated from insulating layer 20. This transfers wiring 32D of wiring-equipped wiring transfer plate 200D to the substrate 10 side, away from plating base material layer 130. More specifically, wiring 32D of wiring-equipped wiring transfer plate 200D is transferred to and thus formed on insulating layer 20. In the present embodiment, wiring body layer 32b and adhesion layer 32a are transferred to insulating layer 20.

By separating wiring transfer plate 100 including projecting structure 140 from insulating layer 20, recess 21a corresponding to via hole 21 is formed in insulating layer 20 above conductor 11, in the portion of insulating layer 20 where projecting structure 140 was embedded. In other words, in the present embodiment as well, recess 21a for via electrode 31D and wiring 32D can be formed on substrate 10 simultaneously.

Next, as illustrated in (d) in FIG. 14, just as in the process illustrated in (d) in FIG. 8, a residue removal process is performed to remove the residue of the insulating material of insulating layer 20. For example, insulating thin film 20a that remains as a residue of the insulating material of insulating layer 20 on top of conductor 11 is removed.

Next, as illustrated in (e) in FIG. 14, just as in the process illustrated in (e) in FIG. 8, seed film 35D is formed so as to cover exposed conductor 11 and wiring 32D. Seed film 35D includes a different type of metal than wiring body layer 32b. More specifically, wiring body layer 32b includes only copper, but seed film 35D includes a metal other than copper.

Next, as illustrated in (f) in FIG. 14, just as in the process illustrated in (f) in FIG. 8, resist 40 is selectively formed on seed film 35D covering wiring 32D so as to expose the portion of seed film 35D covering conductor 11.

Next, as illustrated in (g) in FIG. 14, just as in the process illustrated in (g) in FIG. 8, via electrode body layer 31b is formed on the exposed seed film 35D. More specifically, via electrode body layer 31b is formed so as to fill opening 41 in resist 40. In the present embodiment as well, via electrode body layer 31b is an electrolytic plating film that is stacked on seed film 35D in opening 41 by an electrolytic plating method. More specifically, via electrode body layer 31b is an electrolytic Cu plating film.

Next, as illustrated in (h) in FIG. 14, just as in the process illustrated in (h) in FIG. 8, resist 40 is removed. This exposes the portion of seed film 35D that was covered by resist 40.

Next, as illustrated in (i) in FIG. 14, just as in the process illustrated in (i) in FIG. 8, the portion of seed film 35D covering wiring 32D is removed. More specifically, exposed seed film 35D is removed by etching using an etchant.

In the present embodiment, since wiring body layer 32b of wiring 32D includes a different metal than seed film 35D, seed film 35D can be selectively etched without etching wiring body layer 32b. By etching seed film 35D in this way, only seed film 35D under via electrode body layer 31b remains, and this seed film 35D becomes seed layer 31aD. This allows the formation of via electrode 31D including stacked seed layer 31aD and via electrode body layer 31b.

Note that in the present embodiment, although wiring 32D does not include conductive layer 32c, and wiring body layer 32b is not protected by conductive layer 32c when seed film 35D is etched, since seed film 35D and wiring body layer 32b include different types of metals, it is possible to selectively etch using the etching rate difference between seed film 35D and wiring body layer 32b. Stated differently, although conductive layer 32c is not formed on top of wiring body layer 32b, when seed layer 31aD is etched with an etchant, wiring body layer 32b can be prevented from being removed by the etchant. This can inhibit the line width of wiring 32D from changing due to the thinning of film when etching seed film 35D.

In this way, wiring body 30D including via electrode 31D and wiring 32D is formed and mounting substrate 1D including wiring body 30D can be fabricated. Stated differently, it is possible to fabricate wiring body 30D on substrate 10 including conductor 11 and also to fabricate mounting substrate 1D including wiring body 30D disposed above substrate 10.

In the present embodiment as well, wiring-equipped wiring transfer plate 200D, in which wiring 32D is formed on wiring transfer plate 100 including projecting structure 140, is used to manufacture wiring body 30D and mounting substrate 1D.

With this, in the present embodiment as well, it is possible to manufacture wiring body 30D and mounting substrate 1D including insulating layer 20 with uniform film thickness and small via electrodes 31D, and with high positioning accuracy between via electrodes 31D and wiring 32D.

In the present embodiment, wiring 32D does not include conductive layer 32c, but wiring 32D may include conductive layer 32c.

Embodiment 3

Figure 15:
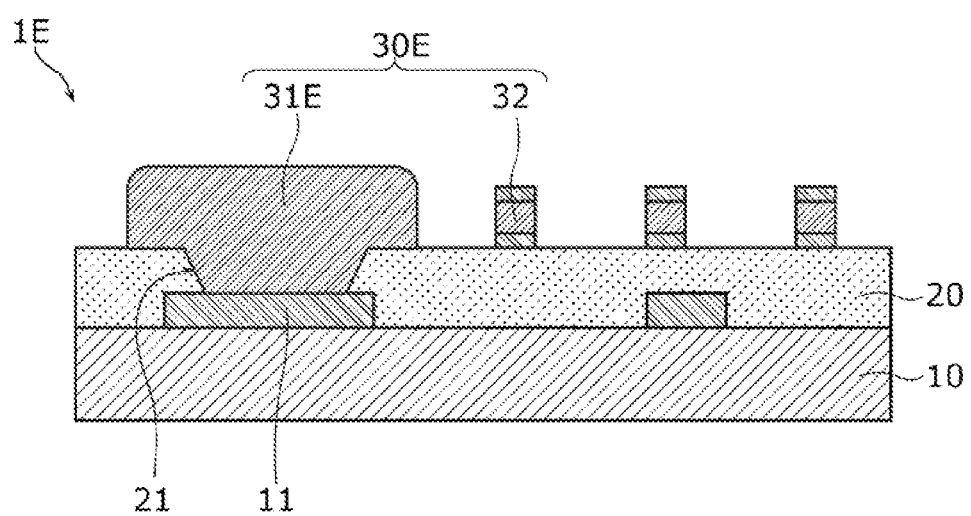
FIG. 15 is a cross-sectional view of a mounting substrate according to Embodiment 3.

Next, the configurations of wiring body 30E and mounting substrate 1E according to Embodiment 3 will be described with reference to FIG. 15. FIG. 15 is a cross-sectional view of mounting substrate 1E according to Embodiment 3.

In Embodiment 1 described above, via electrode 31 includes seed layer 31a and via electrode body layer 31b, which is an electrolytic plating film stacked on seed layer 31a, but this example is non-limiting.

Figure 16:
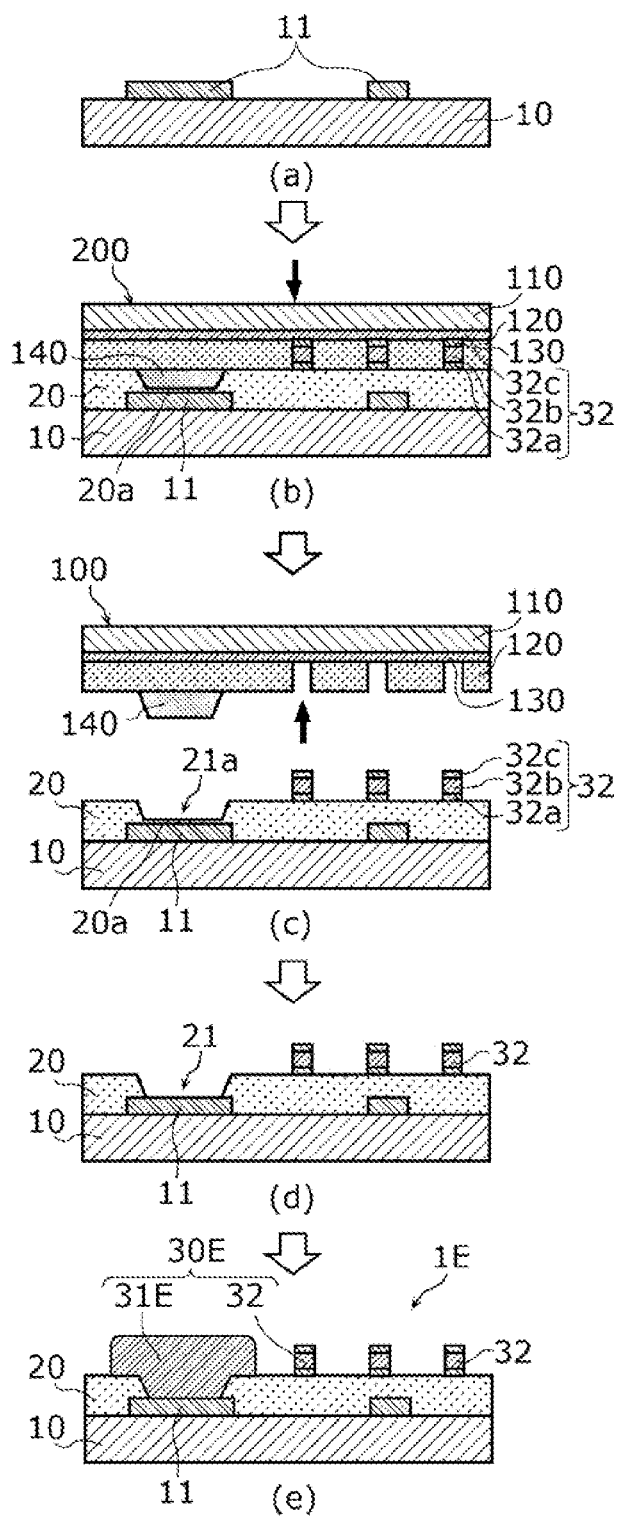
FIG. 16 illustrates a method for manufacturing a wiring body and a method for manufacturing the mounting substrate according to Embodiment 3.

More specifically, as illustrated in FIG. 16, in wiring body 30E and mounting substrate 1E according to the present embodiment, via electrode 31E includes only one metal body. For example, via electrode 31E is formed by conductive paste such as silver paste.

Note that except for the configuration of via electrode 31E, wiring body 30E and mounting substrate 1E according to the present embodiment are the same as wiring body 30 and mounting substrate 1 according to Embodiment 1 described above.

Wiring body 30E and mounting substrate 1E configured as described above are manufactured by the method illustrated in FIG. 16. FIG. 16 illustrates the method for manufacturing wiring body 30E and the method for manufacturing mounting substrate 1E according to Embodiment 3.

Wiring-equipped wiring transfer plate 200, in which wiring 32 is formed on wiring transfer plate 100 including projecting structure 140, is also used in the present embodiment as well. Stated differently, in the present embodiment as well, wiring 32 is formed by a transfer method using wiring-equipped wiring transfer plate 200 that is prepared in advance.

First, as illustrated in (a) through (c) in FIG. 16, wiring 32 is disposed above substrate 10 with insulating layer 20 interposed therebetween. In the present embodiment, the processes illustrated in (a) through (c) in FIG. 16 are the same as the processes illustrated in (a) through (c) in FIG. 8.

Next, as illustrated in (d) in FIG. 16, just as in the process illustrated in (d) in FIG. 8, a residue removal process is performed to remove the residue of the insulating material of insulating layer 20. For example, insulating thin film 20a that remains as a residue of the insulating material of insulating layer 20 on top of conductor 11 is removed.

Next, as illustrated in (e) in FIG. 16, via electrode 31E is formed so as to cover exposed conductor 11. More specifically, via electrode 31E is formed by applying conductive paste.

In this way, wiring body 30E including via electrode 31E and wiring 32 is formed and mounting substrate 1E including wiring body 30E can be fabricated. Stated differently, it is possible to fabricate wiring body 30E on substrate 10 including conductor 11 and also to fabricate mounting substrate 1E including wiring body 30E disposed above substrate 10.

In the present embodiment as well, wiring-equipped wiring transfer plate 200, in which wiring 32 is formed on wiring transfer plate 100 including projecting structure 140, is used to manufacture wiring body 30E and mounting substrate 1E.

With this, in the present embodiment as well, it is possible to manufacture wiring body 30E and mounting substrate 1E including insulating layer 20 with uniform film thickness and small via electrodes 31E, and with high positioning accuracy between via electrodes 31E and wiring 32.

Embodiment 4

Figure 17:
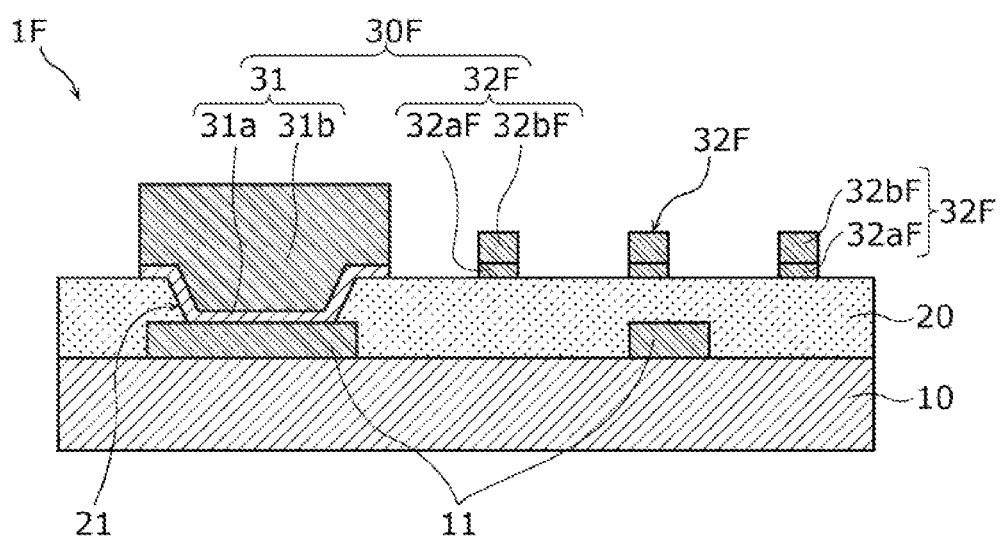
FIG. 17 is a cross-sectional view of a mounting substrate according to Embodiment 3.

Next, the configurations of wiring body 30F and mounting substrate 1F according to Embodiment 4 will be described with reference to FIG. 17. FIG. 17 is a cross-sectional view of mounting substrate 1F according to Embodiment 4.

In Embodiment 1 described above, wiring 32 includes adhesion layer 32a including a fine-textured structure, wiring body layer 32b, which is an electroless plating film of Cu, and conductive layer 32c (a protective layer), which is an electroless plating film of Cu.

More specifically, as illustrated in FIG. 17, in wiring body 30F and mounting substrate 1F according to the present embodiment, wiring 32F does not include conductive layer 32c, which is a protective layer, and includes adhesion layer 32aF and wiring body layer 32bF.

In the present embodiment, adhesion layer 32aF is not a fine-textured structure formed by copper oxide treatment, etc., but an organic thin film formed by organic adhesion treatment. For example, by introducing an organic component having high adhesion strength with the resin included in insulating layer 20 onto the surface of the copper included in wiring body layer 32bF, an organic thin film including an organic component chemically bonded to the resin included in insulating layer 20 and an organic component chemically bonded to the copper included in wiring body layer 32bF can be formed as adhesion layer 32aF. When adhesion layer 32a is formed by copper oxide treatment, there is a possibility that wiring 32 will peel off during etching because copper oxide is weak against acid. However, by forming adhesion layer 32aF by organic adhesion treatment as in the present embodiment, such defects can be inhibited.

In the present embodiment, wiring body layer 32bF is an electroplating film, not an electroless plating film. More specifically, wiring body layer 32bF is an electroplating film including copper.

Another layer including an electroless plating film may be inserted between adhesion layer 32aF and wiring body layer 32bF. In such cases, conductive layer 32c functioning as a protective layer becomes unnecessary because of the etching selectivity between the electroplating film and the electroless plating film.

Note that except for the configuration of wiring 32F, wiring body 30F and mounting substrate 1F according to the present embodiment are the same as wiring body 30 and mounting substrate 1 according to Embodiment 1 described above. The present embodiment can be applied not only to Embodiment 1 described above, but also to Embodiments 2 and 3 described above.

[Variation]

Hereinbefore, the wiring body and mounting substrate according to the present disclosure have been described based on embodiments, but the present disclosure is not limited to Embodiments 1 through 4 described above.

For example, in Embodiment 1 described above, when forming seed layer 31a of via electrode 31, seed layer 31a is formed by etching seed film 35 covering wiring 32 with an etchant, but this example is non-limiting. More specifically, seed layer 31a of via electrode 31 may be formed by a lift-off method. Next, this method will be described with reference to FIG. 18.

Figure 18:
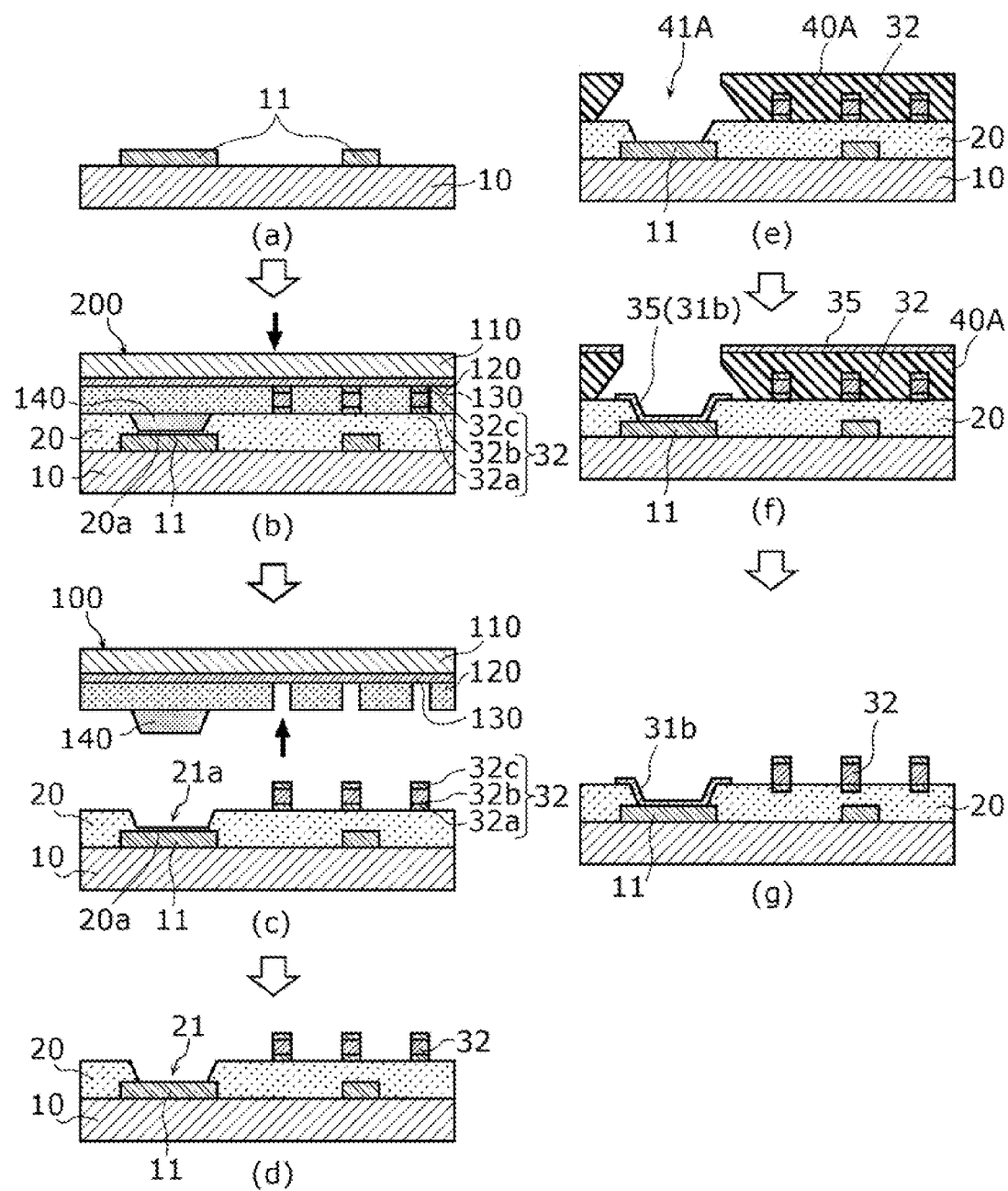
FIG. 18 illustrates a variation of a method for manufacturing a wiring body and a method for manufacturing a mounting substrate.

First, as illustrated in (a) through (c) in FIG. 18, wiring 32 is disposed above substrate 10 with insulating layer 20 interposed therebetween. In the present variation, the processes illustrated in (a) through (c) in FIG. 18 are the same as the processes illustrated in (a) through (c) in FIG. 8.

Next, as illustrated in (d) in FIG. 18, just as in the process illustrated in (d) in FIG. 8, a residue removal process is performed to remove the residue of the insulating material of insulating layer 20.

Next, as illustrated in (e) in FIG. 18, resist 40A is formed to include opening 41A above exposed conductor 11, and wiring 32 is covered with resist 40A.

Next, as illustrated in (f) in FIG. 18, seed film 35 is formed over the entire upper surface of substrate 10. Here, since opening 41A is formed in resist 40A, seed film 35 is separated between the top of conductor 11 and the top of resist 40A.

Next, as illustrated in (g) in FIG. 18, resist 40A is removed. As a result, seed film 35 on resist 40A is removed by lift-off, leaving seed film 35 only on conductor 11. This remaining seed film 35 then becomes seed layer 31a of via electrode 31.

Next, as illustrated in (h) in FIG. 18, via electrode body layer 31b is formed on top of seed layer 31a. More specifically, an electrolytic plating method is used to form via electrode body layer 31b, which includes an electrolytic plating film. More specifically, via electrode body layer 31b is an electrolytic Cu plating film.

In this way, wiring body 30 including via electrode 31 and wiring 32 is formed and mounting substrate 1 including wiring body can be fabricated. Stated differently, it is possible to fabricate wiring body 30 on substrate 10 including conductor 11 and also to fabricate mounting substrate 1 including wiring body 30 disposed above substrate 10. Note that the present variation can also be applied to Embodiment 2 described above.

In Embodiments 1 through 4 described above, insulating layer 120 that serves as the transfer plate insulating layer in wiring transfer plate 100 is a resist, but this is non-limiting. For example, insulating layer 120 may be an insulating resin material including an inorganic material such as $SiO_2$. In such cases, wiring transfer plate 100B including insulating layer 120B can be fabricated by the method illustrated in FIG. 19.

Figure 19:
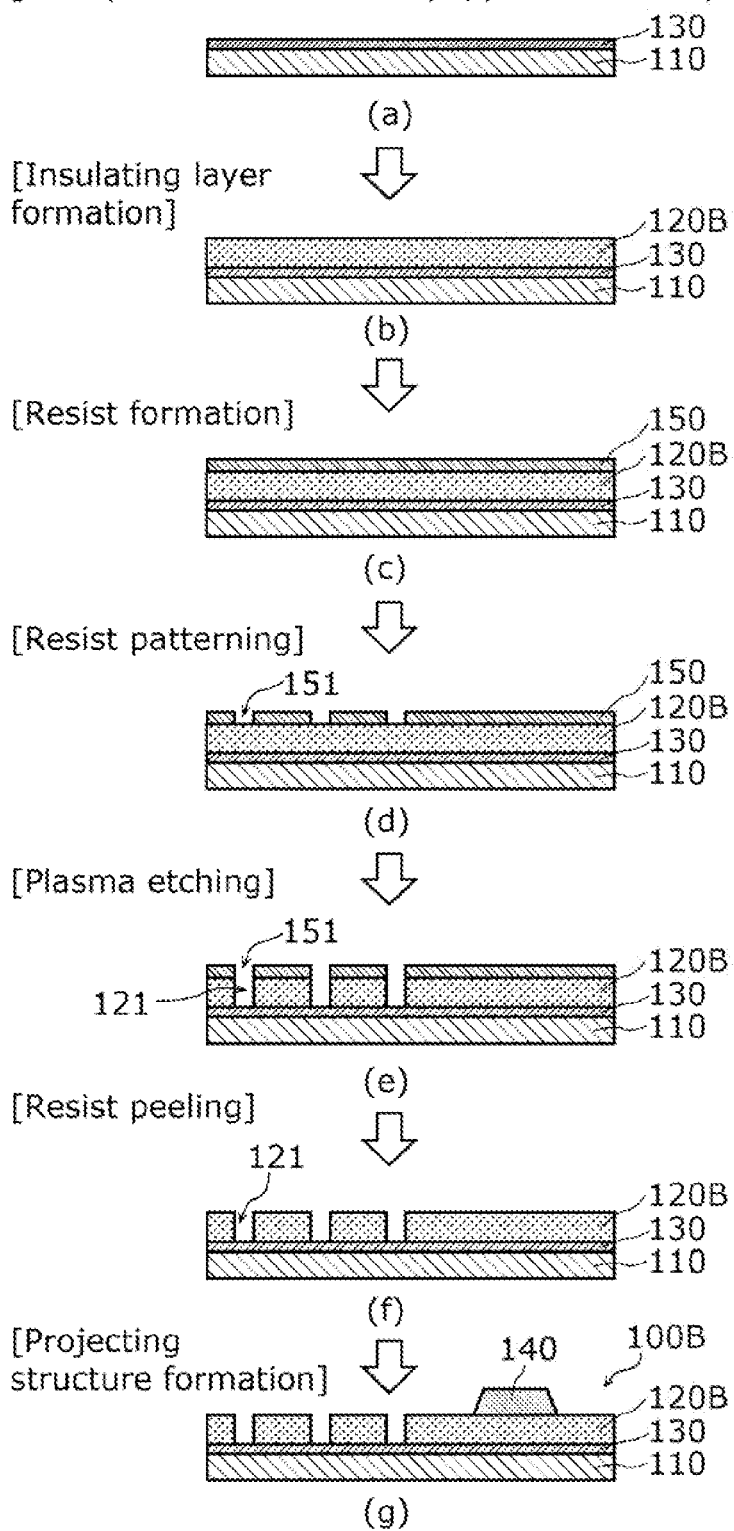
FIG. 19 is a diagram illustrating another example of a method for manufacturing a wiring transfer plate.

First, as illustrated in (a) in FIG. 19, a plating-base-material-equipped base, which includes plating base material layer 130 formed on base 110 that serves as a support substrate, is received. Then, as illustrated in (b) in FIG. 19, insulating layer 120B (the transfer plate insulating layer) including $SiO_2$ is formed on top of plating base material layer 130. Then, resist 150 is formed on top of insulating layer 120, as illustrated in (c) in FIG. 19. Next, as illustrated in (d) in FIG. 19, resist 150 is exposed and developed, etc., to form openings 151 in resist 150 by patterning resist 150 to expose insulating layer 120. Next, as illustrated in (e) in FIG. 19, plasma etching is performed using resist 150 including openings 151 as a mask to form openings 121 in insulating layer 120 to expose plating base material layer 130. Next, as illustrated in (f) in FIG. 19, resist 150 is removed. Then, projecting structure 140 is formed on insulating layer 120B, as illustrated in (g) in FIG. 19. This completes wiring transfer plate 100b.

In Embodiments 1 through 4 described above, the electroless plating film may be an electroplating film, and the electroplating film may be an electrolytic plating film. Stated differently, the electroless plating film and the electroplating film may simply be plating films without distinction.

Embodiments arrived at by a person of skill in the art making various modifications to the above embodiments as well as embodiments realized by arbitrarily combining elements and functions in the embodiments which do not depart from the essence of the present disclosure are included in the present disclosure.

INDUSTRIAL APPLICABILITY

The wiring body according to the present disclosure is applicable as a wiring layer or the like in mounting substrates such as semiconductor package substrates.

REFERENCE SIGNS LIST 1, 1A, 1B, 1C, 1D, 1E, 1F mounting substrate
10 substrate
11 conductor
20 insulating layer
20a insulating thin film
21 via hole
21a recess
30, 30A, 30D, 30E, 30F wiring body
31, 31B, 31D, 31E via electrode
31a, 31aD seed layer
31b via electrode body layer
32, 32A, 32D, 32F wiring
32a, 32aF adhesion layer
32b, 32bF wiring body layer
32c conductive layer
35, 35D seed film
40, 40A resist
41, 41A opening
100, 100A, 100B wiring transfer plate
110 base
120, 120B insulating layer
121 opening
130, 130A plating base material layer
140 projecting structure
150 resist
151 opening
200, 200D wiring-equipped wiring transfer plate
300 wiring body intermediate material

The invention claimed is:

1. A wiring transfer plate for forming wiring to be transferred to another component, the wiring transfer plate comprising:
   a base;
   a release layer formed on the base;
   a transfer plate insulating layer covering the base with an opening above the release layer; and
   a projecting structure formed on the transfer plate insulating layer, the projecting structure for forming, in an insulating layer of a component to which the wiring is to be transferred, a via hole for a via electrode.

2. A wiring-equipped wiring transfer plate including the wiring transfer plate according to claim 1 on which the wiring is formed, the wiring-equipped wiring transfer plate comprising:
   a plating film formed, as the wiring, on the release layer in the opening in the wiring transfer plate.

3. A wiring body intermediate material which is an intermediate material for a wiring body disposed above a substrate including a conductor, the wiring body intermediate material comprising:
   an insulating layer located above the substrate and including a recess that is located above the conductor and recessed from a main surface of the insulating layer; and
   wiring located above the substrate with the insulating layer interposed therebetween, wherein
   the wiring body intermediate material is formed using the wiring-equipped wiring transfer plate according to claim 2, and
   the recess is formed by the projecting structure in the wiring-equipped wiring transfer plate.

4. A method for manufacturing a wiring body, the method comprising:
   preparing a substrate including a conductor;
   preparing the wiring-equipped wiring transfer plate according to claim 2;
   forming an insulating layer between the substrate and the wiring-equipped wiring transfer plate by disposing an insulating material between the substrate and the wiring-equipped wiring transfer plate; and
   separating the wiring transfer plate included in the wiring-equipped wiring transfer plate from the insulating layer, wherein
   in the forming of the insulating layer, the projecting structure of the wiring-equipped wiring transfer plate is disposed within the insulating material, and
   by separating the wiring transfer plate, a recess corresponding to the via hole is formed in a portion of the insulating layer on the conductor, and the wiring formed on the wiring-equipped wiring transfer plate is transferred to the insulating layer.

* * * * *